(12) United States Patent
Hayashi et al.

(10) Patent No.: US 6,317,372 B1
(45) Date of Patent: Nov. 13, 2001

(54) SEMICONDUCTOR MEMORY DEVICE EQUIPPED WITH SERIAL/PARALLEL CONVERSION CIRCUITRY FOR TESTING MEMORY CELLS

(75) Inventors: Tomonori Hayashi; Naoharu Shinozaki; Hiroyoshi Tomita, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/528,983

(22) Filed: Mar. 20, 2000

(30) Foreign Application Priority Data

Jun. 16, 1999 (JP) .................................................. 11-169752

(51) Int. Cl.[7] ..................................................... G11C 29/00
(52) U.S. Cl. ......................... 365/201; 365/220; 365/221; 365/189.08; 365/193; 365/233; 714/722; 714/718
(58) Field of Search .................................... 365/201, 220, 365/221, 219, 189.08, 193, 191, 233; 714/719, 720, 718, 722

(56) References Cited

U.S. PATENT DOCUMENTS 5,949,726 * 9/1999 Tseng et al. ......................... 365/201
6,009,029 * 12/1999 Sher ..................................... 365/201

* cited by examiner

*Primary Examiner*—Andrew Q. Tran
(74) *Attorney, Agent, or Firm*—Arent Fox Kintner Plotkin & Kahn, PLLC

(57) ABSTRACT

An input conversion unit converts serial data supplied from the exterior into parallel data. Each of the converted parallel data is respectively written into a plurality of memory cell areas. An output conversion unit converts parallel data constructed by data read from each memory cell area into serial data. An operational unit is activated during a testing mode so as to logically operate on the parallel data read from each memory cell area. By writing predetermined data into each memory cell area in advance, it is confirmed by a logic operation that correct data is stored in each memory cell area. The data can be checked simultaneously for the plurality of memory cell areas so that the operation test in the memory cell areas can be carried out at high speed. Besides, serial data accepted, twice per cycle of a data strobe signal, is converted into parallel data. Each of the converted parallel data is respectively written into a first memory cell area and a second memory cell area. Parallel data read from the first and second memory cell area is logically operated in a testing mode and the operation result is output at once in synchronization with the clock signal. Accordingly, the data can be checked simultaneously for the first and the second memory cell area so that the operation test in the memory cell areas can be carried out at high speed.

13 Claims, 18 Drawing Sheets

SEMICONDUCTOR MEMORY DEVICE EQUIPPED WITH SERIAL/PARALLEL CONVERSION CIRCUITRY FOR TESTING MEMORY CELLS

BACKGROUND OF THE INVENTION

1. Field of the Invention

The present invention relates to a semiconductor integrated circuit which inputs/outputs data from/to the exterior in the form of serial data, and which reads/writes data from/into memory cells in the form of parallel data.

In addition, the present invention relates to a semiconductor integrated circuit which has testing modes for the data read/write tests of memory cells. More particularly, it relates to techniques for reducing testing costs.

2. Description of the Related Art

A DDR-SDRAM (Double Data Rate Synchronous DRAM)or the like have been known as semiconductor integrated circuits in each of which data are inputted/outputted from/to the exterior in series, and data are read/written from/into memory cells in parallel. The DDR-SDRAM inputs/outputs data from/to the exterior in synchronization with both the rising edge and the falling edge of a data strobe signal DQS, and thus permits the write/read of the data to proceed at high speed.

FIG. 1 shows the outline of the DDR-SDRAM of this kind.

The DDR-SDRAM 1 comprises an input data latching unit 2, an output data latching unit 3, an address inputting unit 4, a predecoder 5, a timing controlling unit 6, a command decoder 7, a memory core unit 8, input buffers 9, and pads 10. Actually, a plurality of memory core units 8 are formed in a chip.

The input data latching unit 2 accepts a data signal DQ and a data strobe signal DQS (as signals DQIN and DQSIN) through the input buffers 9, and outputs write data signals GWED, GWOD. This input data latching unit 2 receives a data address signal GCA and an internal clock signal LCLK0.

The output data latching unit 3 receives the data address signal GCA and internal clock signals CLK0, CLK180, and it accepts read data signals GRED, GROD from the memory core unit 8, and outputs the accepted data as the data signal DQ.

The address inputting unit 4 accepts an address signal AD from the exterior in synchronization with a clock signal CLK and outputs the accepted data as an internal address signal ADIN.

The predecoder 5 receives the internal address signal ADIN and a timing signal Ti, and outputs a predecoded signal PDEC.

The timing controlling unit 6 receives the clock signal CLK, a clock signal /CLK and a control command signal CMD1, and outputs the internal clock signals CLK0, CLK180, LCLK0, the data address signal GCA, an enable signal EN and the timing signal T1.

The command decoder 7 receives the clock signal CLK and a command signal CMD, and outputs the control command signal CMD1 and test command signals TEST1, TEST2. The test command signal TEST1 is a signal which becomes a high level during a DDR data compression test mode and an SDR data compression test mode to be explained later. On the other hand, the test command signal TEST2 is a signal which becomes a high level during the SDR data compression test mode.

The memory core unit 8 is constructed of an even-numbered core unit 8a and an odd-numbered core unit 8b. Each of the even-numbered core unit 8a and the odd-numbered core unit 8b includes a write controlling circuit 11, a write amplifier 12, a read amplifier 13, a sense amplifier 14, a decoder 15, and a memory cell area 16 having a plurality of memory cells (memory cell areas 16a, 16b corresponding to the respective core units 8a, Bb). The even-numbered core unit 8a is a circuit which is activated when an address signal A0 (the lowest address) is brought to a low level. In contrast, the odd-numbered core unit 8b is a circuit which is activated when the address signal A0 is brought to a high level.

The write controlling circuit 11 is a circuit which transmits the write data signal GWED or GWOD to the write amplifier 12. Further, the write amplifier 12 is a circuit which outputs the write data signal GWED or GWOD to the sense amplifier 14. Besides, the read amplifier 13 is a circuit which outputs data amplified by the sense amplifier 14, as the read data signal GRED or GROD. In addition, the decoder 15 is a circuit which receives the predecoded signal PDEC and which outputs a decoded signal (not shown). The write data signals GWED, GWOD and the read data signals GRED, GROD are signals which are used in common by all the memory core units 8, and the lengths of wiring for the signals are long.

Incidentally, an expression "/" as in the clock signal /CLK signifies the negative logic. Each signal indicated by a bold line consists of a plurality of signals. By way of example, the read data signal GRED (or GROD) is composed of read data signals GRED0, GRED1, GRED2 and GRED3 (or read data signals GROD0, GROD1, GROD2 and GROD3). Likewise, the write data signal GWED (or GWOD) is composed of write data signals GWED0, GWED1, GWED2 and GWED3 (or write data signals GWOD0, GWOD1, GWOD2 and GWOD3). The read data signals GRED0–GRED3, GROD0–GROD3 and the write data signals GWED0–GWED3, GWOD0–GWOD3 correspond to data signals DQ0–DQ3, respectively.

FIG. 2 shows the input data latching unit 2 for a data signal DQ0. Each of input data latching units for data signals DQ1–DQ3 is the same as the input data latching unit 2.

The input data latching unit 2 includes flip-flop circuits 17a, 17b, 17c, transmitting circuits 18, 19, and a data switching circuit 20.

The flip-flop circuit 17a accepts an internal data signal DQIN0 in synchronization with the rise of the internal data strobe signal DQSIN, and outputs a write data signal DU0. Subsequently, the flip-flop circuit 17b accepts the write data signal DU0 in synchronization with the fall of the internal data strobe signal DQSIN, and outputs a write data signal DU. Further, the flip-flop circuit 17c accepts the internal data signal DQIN0 in synchronization with the fall of the internal data strobe signal DQSIN, and outputs a write data signal DL.

The transmitting circuit 18 includes CMOS (complementary metal-oxide-semiconductor) transmission gates 18a, 18b in each of which the sources and drains of a pMOS (p-channel MOS) transistor and an nMOS (n-channel MOS) transistor are connected to each other, and an inverter 18c. Hereinbelow, the pMOs transistor and nMOS transistor shall be simply termed the "pMOS" and "nMOS", respectively. The CMOS transmission gate 18a receives the write data signal DU and outputs a write data signal DU2. On the other hand, the CMOS transmission gate 18b receives the write data signal DL and outputs a write data signal DL2.

The gates of the pMOS 's (pMOS transistors) of the CMOS transmission gates 18a, 18b receive the inverted signal of an internal data strobe signal DS through the inverter 18c. Also, the gates of the nMOS's (nMOS transistors) of the CMOS transmission gates 18a, 18b receive the internal data strobe signal DS. Here, the internal data strobe signal DS is a signal which reatains a high level for a predetermined time period when the data strobe signal DQS is at a low level.

The switching circuit 20 includes CMOS transmission gates 20a, 20b, 20c, 20d in each of which the sources and drains of a pMOS and an nMOS are connected to each other, and an inverter 20e. The CMOS transmission gates 20a, 20c receive the write data signal DU2 and outputs the received signal as write data signals WED0, WOD0, respectively. On the other hand, the CMOS transmission gates 20b, 20d receive the write data signal DL2 and outputs the received signal as the write data signals WED0, WOD0, respectively. The gates of the pMOS's of the CMOS transmission gates 20a, 20d and those of the nMOS's of the CMOS transmission gates 20b, 20c receive the inverted signal of the data address signal GCA through the inverter 20e. Also, the gates of the nMOS's of the CMOS transmission gates 20a, 20d and those of the pMOS's of the CMOS transmission gates 20b, 20c receive the data address signal GCA.

The transmitting circuit 19 is the same circuit as the transmitting circuit 18. A CMOS transmission gate 19a receives the write data signal WED0 and outputs a write data signal GWED0. In addition, a CMOS transmission gate 19b receives the write data signal WOD0 and outputs a write data signal GWOD0. The gates of the pMOS 's of the CMOS transmission gates 19a, 19b receive the inverted signal of the internal clock signal LCLK0 through an inverter 19c. Also, the gates of the nMOS's of the CMOS transmission gates 19a, 19b receive the internal clock signal LCLK0.

FIG. 3 shows the write controlling circuit 11 and the circuits around it.

The write controlling circuit 11 includes a timing generator 21, eight switching circuits 22 which supply the write data signals GWED0–GWED3, GWOD0–GWOD3 to the write amplifiers 12, respectively, and an inverter 23.

The timing generator 21 receives the address signal A0, the internal clock signal CLK0 and the test command signal TEST2, and outputs timing signals T2, T3. This timing generator 21 is a circuit which is activated upon receiving the high level of the test command signal TEST2 during the SDR data compression test mode, thereby to generate the timing signal T2 for controlling the write amplifiers 12 of the even-numbered core unit 8a and the timing signal T3 for controlling the write amplifiers 12 of the odd-numbered core unit 8b. Incidentally, the timing generator 21 is not activated during a normal operation mode or during an ordinary data compression test mode.

Each of the switching circuits 22 includes two CMOS transmission gates 22a, 22b in each of which the sources and drains of a pMOS and an nMOS are connected to each other. The input nodes of the four CMOS transmission gates 22a of the even-numbered core unit 8a receive the corresponding ones of the write data signals GWED0–GWED3, respectively. The input nodes of all the CMOS transmission gates 22b of the even-numbered core unit 8a receive the write data signal GWED0. On the other hand, the input nodes of the four CMOS transmission gates 22a of the odd-numbered core unit 8b receive the corresponding ones of the write data signals GWOD0–GWOD3, respectively. The input nodes of all the CMOS transmission gates 22b of the odd-numbered core unit 8b receive the write data signal GWOD0. The output nodes of the pair of CMOS transmission gates 22a, 22b are connected to each other so as to supply the outputs thereof to the corresponding write amplifier 12. The gate of the pMOS of the CMOS transmission gate 22a and that of the nMOS of CMOS transmission gate 22b receive the test command signal TEST1. Also, the gate of the nMOS of the CMOS transmission gate 22a and that of the pMOS of CMOS transmission gate 22b receive the inverted signal of the test command signal TEST1 through the inverter 23.

The write amplifiers 12 of the even-numbered core unit 8a are supplied with the timing signal T2. On the other hand, the write amplifiers 12 of the odd-numbered core unit 8b receive the timing signal T3.

FIG. 4 shows the output data latching unit 3 for the data signal DQ0, and the circuits around it.

The output data latching unit 3 includes two logic operational 24, 25, two switches 26, 27 and a data outputting circuit 28.

The operational circuit 24 includes a 4-input NAND gate 24a, a 4-input NOR gate 24b, an inverter 24c, and a 2-input NAND gate 24d. The input nodes of the NAND gate 24a and the NOR gate 24b receive the corresponding ones of the read data signals GRED0–GRED3, respectively. The output node of the NOR gate 24b is connected to the input node of the inverter 24c. The input nodes of the NAND gate 24d are connected to the output node of the NAND gate 24a and that of the inverter 24c, respectively. The NAND gate 24d outputs a detection signal TED.

The operational circuit 25 is the same circuit as the operational circuit 24. The input nodes of a NAND gate 25a and a NOR gate 25b receive the corresponding ones of the read data signals GROD0–GROD3. A NAND gate 25d outputs a detection signal TOD.

The switch 26 is a circuit which outputs the read data signal GRED0 as a read data signal RED when the test command signal TEST2 is at a low level, and which outputs the detection signal TED as the read data signal RED when the test command signal TEST2 is at the high level. On the other hand, the switch 27 is a circuit which outputs the read data signal GROD0 as a read data signal ROD when the test command signal TEST2 is at the low level, and which outputs the detection signal TOD as the read data signal ROD when the test command signal TEST2 is at the high level. Each of the switches 26, 27 is formed by combining a CMOS transmission gate and an inverter.

The data outputting circuit 28 includes a switching circuit 29, a transmitting circuit 30, and another transmitting circuit 31. The switching circuit 29 and the transmitting circuit 30 are the same circuits as the switching circuit 20 and the transmitting circuit 18 which are shown in FIG. 2, respectively.

The CMOS transmission gates 29a, 29c of the switching circuit 29 receive the read data signal RED, and outputs the received signal as read data signals RED0, ROD0, respectively. Likewise, the CMOS transmission gates 29b, 29d of the switching circuit 29 receive the read data signal ROD, and outputs the received signal as the read data signals RED0, ROD0, respectively. The gates of the pMOS's of the CMOS transmission gates 29a, 29d and those of the nMOS's of the CMOS transmission gates 29b, 29c receive the inverted signal of the data address signal GCA through an inverter 29e. The gates of the nMOS's of the CMOS transmission gates 29a, 29d and those of the pMOS's of the CMOS transmission gates 29b, 29c receive the data address signal GCA.

The CMOS transmission gate 30a of the transmitting circuit 30 receives the read data signal RED0, and outputs a read data signal RED1. On the other hand, the CMOS transmission gate 30b of the transmitting circuit 30 receives the read data signal ROD0, and outputs a data output signal DOUT0. The gates of the pMOS's of the CMOS transmission gates 30a, 30b receive the inverted signal of the internal clock signal CLK0 through an inverter 30c. Also, the gates of the nMOS's of the CMOS transmission gates 30a, 30b receive the internal clock signal CLK0.

The transmitting circuit 31 includes three inverters 31a, 31b, 31c, a 2-input NOR gate 31d, and a CMOS transmission gate 31e. The respective input nodes of the NOR gate 31d receive the test command signal TEST1, and the inverted signal of the clock signal CLK180 as produced through the inverter 31a. The gate of the pMOS of the CMOS transmission gate 31e is connected to the output node of the NOR gate 31d through the inverter 31b. Further, the gate of the nMOS of the CMOS transmission gate 31e is connected to the output node of the inverter 31b through the inverter 31c. Besides, the input node of the CMOS transmission gate 31e receives the read data signal RED1. Thus, the CMOS transmission gate 31e outputs the read data signal DOUT0 corresponding to the data signal DQ0.

Each of the read data signals GRED0–GRED3, GROD0–GROD3 are connected to the plurality of read amplifiers 13. Each of the read amplifiers 13 receives the data from the sense amplifier 14 (not shown in FIG. 4). The four read amplifiers 13 on the left side of FIG. 4 receive a signal which has been obtained by taking the AND logic between the enable signal EN and an address signal A1. On the other hand, the four read amplifiers 13 on the right side of FIG. 4 receive a signal which has been obtained by taking the AND logic between the enable signal EN and an address signal/A1. Thus, the read data signals are outputted from the read amplifiers 13 on the left side of the figure when the address signal A1 is at a high level, and the read data signals are outputted from the read amplifiers 13 on the right side of the figure when the address signal/A1 is at a high level (that is, the address signal A1 is at a low level).

Incidentally, each of the respective output data latching units for the data signals DQ1–DQ3 is constructed of only the data outputting circuit 28 of the output data latching unit 3. In each of the respective output data latching units for the data signals DQ1–DQ3, accordingly, the read data signals GRED0–GRED3, GROD0–GROD3 are directly supplied to the data outputting circuit 28 as the read data signals RED, ROD.

In the above DDR-SDRAM 1, a DDR data compression test or an SDR data compression test is performed as explained later. Upon receiving the command signal supplied from the exterior, the DDR-SDRAM 1 shifts into the test mode. More specifically, when both the test command signals TEST1 and TEST2 are at the high levels, the DDR-SDRAM 1 performs the DDR data compression test. Besides, when the test command signal TEST1 is at the low level with the signal TEST2 being at the high level, the DDR-SDRAM 1 performs the SDR data compression test.

Here, the data compression test is a read or write operation test which is performed by compressing a plurality of read data signals or write data signals. Such data compression tests are often carried out in a probing test in the state of a wafer, and for the verification of the operation of a chip at the beginning of a final test after assemblage into a package.

The DDR data compression test is a test in which data are accepted and output twice within one cycle of the clock signal CLK. In the DDR data compression test, the data are inputted and outputted at high speed same as in the normal operation. Therefore, the time period of the test can be shortened. On the other hand, however, the data are output and accepted in synchronization with both the edges of the clock signal, so that an expensive testing apparatus such as a high-speed LSI tester is necessitated. As a result, the cost of the test rises.

The SDR data compression test is a test in which data are accepted and output once within one cycle of the clock signal CLK. This SDR data compression test can be performed at the same timings as those of an SDRAM in the prior art, and can therefore employ a conventional LSI tester or the like having been used for the evaluation of the SDRAM. It is accordingly permitted to utilize the specifications of a testing board for mounting a chip and a testing program in the prior art. As a result, the testing cost is reduced. Moreover, the time period of the test is equal to that in the prior art.

FIG. 5 shows the write timings of data in the DDR data compression test. During the DDR data compression test mode, the test command signal TEST1 is kept at the high level, and the test command signal TEST2 is kept at the low level.

The flip-flop circuit 17a shown in FIG. 2 accepts the internal data signal DQIN0 in synchronization with the rise of the internal data strobe signal DQSIN, and outputs accepted signal as the write data signal DU0 (at (a) in FIG. 5). Subsequently, the flip-flop circuit 17b accepts the write data signal DU0 in synchronization with the fall of the internal data strobe signal DQSIN, and outputs the accepted signal as the write data signal DU. Also, the flip-flop circuit 17c accepts the internal data signal DQIN0 in synchronization with the fall of the internal data strobe signal DQSIN, and outputs the accepted signal as the write data signal DL (at (b) in FIG. 5). Thus, the data signal DQ0 is accepted twice in synchronization with the rise and fall of the data strobe signal DQS.

Upon receiving the high level of the internal data strobe signal DS, the transmitting circuit 18 outputs the respective write data signals DU, DL as the write data signals DU2, DL2 (at (c) in FIG. 5).

Subsequently, upon receiving the high level of the data address signal GCA, the switching circuit 20 outputs the respective write data signals DU2, DL2 as the write data signals WED0, WOD0 (at (d) in FIG. 5).

Thereafter, upon receiving the high level of the internal clock signal LCLK0, the transmitting circuit 19 outputs the respective write data signals WED0, WOD0 as the write data signals GWED0, GWOD0 (at (e) in FIG. 5).

The timing generator 21 shown in FIG. 3 is held in an inactive state by receiving the low level of the test command signal TEST2. Each of the switching circuits 22 of the write controlling circuit 11 turns on the CMOS transmission gate 22b and turns off the CMOS transmission gate 22a when it has received the high level of the test command signal TEST1.

Each of the write amplifiers 12 receives the corresponding write data signal GWED0 or GWOD0 through the CMOS transmission gate 22b, and writes the received data signal GWED0 or GWOD0 into the corresponding memory cell area 16a or 16b. Therefore, the data signal DQ0 is written as the data signals DQ0–DQ3 into the memory cell areas 16a and 16b.

FIG. 6 shows the read timings of data in the DDR data compression test.

The timing controlling unit 6 shown in FIG. 1 outputs the internal clock signal CLK0 in synchronization with the rise of the clock signal CLK (at (a) in FIG. 6). In addition, the timing controlling unit 6 outputs the internal clock signal CLK180 in synchronization with the rise of the internal clock signal/CLK (at (b) in FIG. 6). The timing controlling unit 6 also outputs the data address signal GCA which corresponds to, for example, one cycle of the clock signal CLK (at (c) in FIG. 6). The data address signal GCA is a signal for determining the outputting sequence of the read data which are output from the even-numbered core unit 8a and the odd-numbered core unit 8b.

The logic operational circuit 24 shown in FIG. 4 executes the logic operation of the read data signals GRED0–GRED3 outputted from the read amplifiers 13, and outputs the operation result as the detection signal TED. Likewise, the operational circuit 25 executes the logic operation of the read data signals GROD0–GROD3 outputted from the read amplifiers 13, and it outputs the operation result as the detection signal TOD. Since "all 0's" or "all 1's" are written in the memory cells beforehand, the detection signals TED, TOD become the high levels in case of a correct operation test. In a case where erroneous data have been read, the detection signals TED, TOD become the low levels. In general, such a test is called the "1–0 testing mode method".

Upon receiving the high level of the test command signal TEST2, the switch 26 outputs the detection signal TED as the read data signal RED. Also, upon receiving the high level of the test command signal TEST2, the switch 27 outputs the detection signal TOD as the read data signal ROD.

The switching circuit 29 turns on the CMOS transmission gates 29a, 29d and turns off the CMOS transmission gates 29b, 29c by receiving the high level of the data address signal GCA. The read data signals RED, ROD are respectively outputted as the read data signals RED0, ROD0 to the transmitting circuit 30 (at (d) and (e) in FIG. 6).

The transmitting circuit 30 outputs the read data signal ROD0 as the data output signal DOUT0 on the occasion of the high level of the internal clock signal CLK0 (at (f) in FIG. 6). As a result, the detection signal TOD is output as the data signal DQ0 through an output buffer (not shown). At the same time, the transmitting circuit 30 outputs the read data signal RED0 as the read data signal RED1. The transmitting circuit 31 keeps the CMOS transmission gate 31e turned off for the time period during which the internal clock signal CLK180 is at the low level. Therefore, the read data signal RED1 outputted from the CMOS transmission gate 30a of the transmitting circuit 30 is not output as the data output signal DOUT0.

Upon receiving the low level of the internal clock signal CLK0, the transmitting circuit 30 stops outputting the read data signals RED0, ROD0. On this occasion, the values of the read data signal RED1 and the data output signal DOUT0 are held at predetermined levels by latches not shown.

Meantime, the transmitting circuit 31 is kept activated by the low level of the test command signal TEST1. Upon receiving the high level of the internal clock signal CLK180, the transmitting circuit 31 turns on the CMOS transmission gate 31e, thereby to output the read data signal RED1 as the data output signal DOUT0 (at (g) in FIG. 6). As a result, the detection signal TED is output as the data signal DQ0 through an output buffer (not shown). In this way, the detection signals TED, TOD into each of which 4-bit data corresponding to the data signals DQ0–DQ3 have been compressed are outputted in one cycle of the clock signal CLK, and the read test of the 8-bit data in total is performed in the cycle.

FIG. 7 shows the write timings of data in the SDR data compression test.

During the SDR data compression test mode, both the test command signals TEST1, TEST2 are kept at the high levels.

The flip-flop circuit 17a shown in FIG. 2 accepts the internal data signal DQIN0 in synchronization with the rise of the internal data strobe signal DQSIN, and outputs the accepted signal as the write data signal DU0 (at (a) in FIG. 7). Subsequently, the flip-flop circuit 17b accepts the write data signal DU0 in synchronization with the fall of the internal data strobe signal DQSIN, and outputs the accepted signal as the write data signal DU (at (b) in FIG. 7). Also, the flip-flop circuit 17c accepts the internal data signal DQIN0 in synchronization with the fall of the internal data strobe signal DQSIN, and outputs the accepted signal as the write data signal DL. Here in the SDR data compression test mode, the data signal DQ0 is supplied only when the data strobe signal DQS is at the high level. That is, the data signal DQ0 is supplied once in one cycle of the data strobe signal DQS. Therefore, the internal data signal DQIN0 accepted in synchronization with the fall of the internal data strobe signal DQSIN is not the essential write data. In FIG. 7, signals which are not the essential write data are indicated by broken lines.

Upon receiving the high level of the internal data strobe signal DS, the transmitting circuit 18 outputs the write data signal DU as the write data signal DU2 (at (c) in FIG. 7).

Subsequently, upon receiving the high level of the data address signal GCA, the switching circuit 20 outputs the write data signal DU2 as the write data signal WED0 (at (d) in FIG. 7).

Thereafter, upon receiving the high level of the internal clock signal LCLK0, the transmitting circuit 19 outputs the write data signal WED0 as the write data signal GWED0 (at (e) in FIG. 7).

The timing generator 21 shown in FIG. 3 is held in an active state by receiving the high level of the test command signal TEST2. Upon receiving the high level of the address signal A0 and the internal clock signal CLK0, the timing generator 21 keeps the timing signal T2 at the high level for a predetermined time period (at (f) in FIG. 7). Meantime, the timing signal T3 is kept at the low level.

Each of the write amplifiers 12 of the even-numbered core unit 8a is activated by receiving the high level of the timing signal T2. On the other hand, each of the write amplifiers 12 of the odd-numbered core unit 8b is held in an inactive state by receiving the low level of the timing signal T3. Each of the switching circuits 22 turns on the CMOS transmission gate 22b and turns off the CMOS transmission gate 22a when it has received the high level of the test command signal TEST1.

Each of the write amplifiers 12 of the even-numbered core unit 8a receives the write data signal GWED0 through the CMOS transmission gate 22b, and writes the received write data signal GWED0 into the memory cell area 16a. Therefore, the data signal DQ0 is written into the memory cell area 16a of the even-numbered core unit 8a (as the data signals DQ0–DQ3).

Besides, the flip-flop circuit 17a shown in FIG. 2 accepts the next internal data signal DQIN0 in synchronization with the rise of the internal data strobe signal DQSIN, and outputs the accepted signal as the write data signal DU0 (at (g) in FIG. 7). The transmitting circuit 18 outputs the write data signal DU2 in the same manner as in the foregoing (at (h) in FIG. 7).

Subsequently, upon receiving the low level of the data address signal GCA, the switching circuit 20 outputs the write data signal DU2 as the write data signal WOD0 (at (j) in FIG. 7).

Thereafter, upon receiving the high level of the internal clock signal LCLK0, the transmitting circuit 19 outputs the write data signal WOD0 as the write data signal GWOD0 (at (k) in FIG. 7).

Upon receiving the low level of the address signal A0 and the internal clock signal CLK0, the timing generator 21 shown in FIG. 3 keeps the timing signal T3 at the high level for a predetermined time period (at (m) in FIG. 7). Meantime, the timing signal T2 is kept at the low level.

Each of the write amplifiers 12 of the odd-numbered core unit 8b is activated by receiving the high level of the timing signal T3. On the other hand, each of the write amplifiers 12 of the even-numbered core unit 8a is inactivated by receiving the low level of the timing signal T2. Each of the switching circuits 22 turns on the CMOS transmission gate 22b and turns off the CMOS transmission gate 22a when it has received the high level of the test command signal TEST1.

Each of the write amplifiers 12 of the odd-numbered core unit 8b receives the write data signal GWOD0 through the CMOS transmission gate 22b, and writes the received write data signal GWOD0 into the memory cell area 16b. Therefore, the data signal DQ0 is written into the memory cell area 16b of the odd-numbered core unit 8b (as the data signals DQ0–DQ3).

As a result, the data are respectively written into the even-numbered core unit 8a and the odd-numbered core unit 8b in the two cycles of the data strobe signal DQS.

FIG. 8 shows the read timings of data in the SDR data compression test.

During the SDR read test, both the test command signals TEST1, TEST2 are kept at the high levels. The transmitting circuit 31 shown in FIG. 4 receives the high level of the test command signal TEST1, and normally turns off the CMOS transmission gate 31e.

In the first cycle of the clock signal CLK, the switching circuit 29 receives the high level of the data address signal GCA, thereby to output the read data signals RED, ROD to the transmitting circuit 30 as the read data signals RED0, ROD0, respectively. Further, in the second cycle of the clock signal CLK, the switching circuit 29 receives the low level of the data address signal GCA, thereby to output the read data signals RED, ROD to the transmitting circuit 30 as the read data signals ROD0, RED0, respectively.

In the first cycle of the clock signal CLK, the transmitting circuit 30 receives the high level of the internal clock signal CLK0, thereby to output the read data signal ROD0 as the data output signal DOUT0. As a result, the detection signal TOD is output as the data signal DQ through the data output signal DOUT0 (at (a) in FIG. 8). At the same time, the transmitting circuit 30 outputs the read data signal RED0 as the read data signal RED1 toward the CMOS transmission gate 31e kept turned off.

In the second cycle of the clock signal CLK, the transmitting circuit 30 receives the high level of the internal clock signal CLK0, thereby to output the read data signal RED0 as the data output signal DOUT0. As a result, the detection signal TED is output as the data signal DQ through the data output signal DOUT0 (at (b) in FIG. 8). At the same time, the transmitting circuit 30 outputs the read data signal ROD0 as the read data signal RED1. The transmitting circuit 31 keeps the CMOS transmission gate 31e turned off for the time period during which the test command signal TEST1 is at the high level. Therefore, the read data signal RED1 outputted from the CMOS transmission gate 30a of the transmitting circuit 30 is not output as the data output signal DOUT0.

In this way, the detection signals TOD, TED into each of which 4-bit data corresponding to the data signals DQ0–DQ3 have been compressed are outputted in the two cycles of the clock signal CLK, and the read test of the 8-bit data is performed.

Meanwhile, since the DDR data compression test explained above is carried out in synchronization with both the clock signals CLK,/CLK, it has been incapable of utilizing the testing apparatus such as the LSI tester for the conventional SDRAM. The test has, therefore, had the problem that the ratio of the testing cost to the production cost of the DDR-SDRAM 1 increases substantially.

Moreover, in the write operation of the SDR data compression test explained above, the time period corresponding to the two cycles of the data strobe signal DQS has been required for writing the data into the even-numbered core unit 8a and the odd-numbered core unit 8b.

In the read operation of the SDR data compression test, notwithstanding that the detection signals TED, TOD, which are the 8-bit compression test result, are generated in the first cycle of the clock signal CLK, only 4-bit compression test result is outputted during one cycle of the clock signal CLK. Therefore, the SDR data compression test can utilize the testing environment of the conventional SDRAM, but it cannot implement a test fully exploiting the functions of the DDR-SDRAM 1, and it has expended a long time.

In this regard, the inventor has proposed a circuit which can output 8-bit compression test result during one cycle of the clock signal CLK in the read operation of the SDR data compression test.

FIG. 9 shows the output data latching unit 32 proposed by the inventor, and circuits around it. Incidentally, the circuits shown in FIG. 9 have not been known yet.

A DDR-SDRAM 1 is formed with sixteen wiring lines for read data signals GRED0–GRED7 and GROD0–GROD7. The construction of the DDR-SDRAM 1 except the output data latching unit 32 is the same as explained before.

The output data latching unit 32 is constructed of two logic operational circuits 33, 34, two switches 35, 36, and the same data outputting circuit 28 as shown in FIG. 4.

The operational circuit 33 includes an 8-input NAND gate 33a, an 8-input NOR gate 33b, an inverter 33c and a 2-input NAND gate 33d. The input nodes of the NAND gate 33a and NOR gate 33b receive the corresponding read data signals GRED0–GRED7, respectively. The output node of the NOR gate 33b is connected to the input node of the inverter 33c. Besides, the input nodes of the NAND gate 33d are respectively connected to the output node of the NAND gate 33a and that of the inverter 33c. The NAND gate 33d outputs the detection signal TED.

The operational circuit 34 is the same circuit as the operational circuit 33. The input nodes of the NAND gate 34a and NOR gate 34b of the operational circuit 34 receive the corresponding read data signals GROD0–GROD7, respectively. The NAND gate 34d of the operational circuit 34, the input nodes of which are respectively connected to the output nodes of the NAND gate 34a and inverter 34c thereof, outputs the detection signal TOD.

Each of the switches 35, 36 includes two switching elements, and it has the function of outputting the predetermined one of three inputted signals as the read data signal RED or ROD.

More specifically, the switch 35 functions to select the read data signal GRED0 when the address signal A1 is at the low level, and to select the read data signal GRED4 when the address signal A1 is at the high level. In addition, the switch 35 functions to output the read data signal GRED0 (or GRED4) selected on the basis of the address signal A1, as the read data signal RED when the test command signal TEST2 is at the low level, and to output the detection signal TED as the read data signal RED when the test command signal TEST2 is at the high level.

Likewise, the switch 36 functions to select the read data signal GROD0 when the address signal A1 is at the low level, and to select the read data signal GROD4 when the address signal A1 is at the high level. In addition, the switch 36 functions to output the read data signal GROD0 (or GROD4) selected on the basis of the address signal A1, as the read data signal ROD when the test command signal TEST2 is at the low level, and to output the detection signal TOD as the read data signal ROD when the test command signal TEST2 is at the high level. Each of the switches 35, 36 is formed by combining CMOS transmission gates and inverters.

The read data signals GRED0–GRED7, GROD0–GROD7 are respectively supplied from the read amplifiers 13. Each of the read amplifiers 13 is supplied with the data from the sense amplifier 14 (not shown in FIG. 9). The four read amplifiers 13 on the left side of FIG. 9 receive a signal which has been obtained by taking the OR logic between the test command signal TEST2 and the AND logic of the enable signal EN and address signal A1. On the other hand, the four read amplifiers 13 on the right side of the figure receive a signal which has been obtained by taking the OR logic between the test command signal TEST2 and the AND logic of the enable signal EN and address signal/A1. Thus, when the test command signal TEST2 is at the high level, all of the read amplifiers 13 connected to the read data signals GRED0–GRED7, GROD0–GROD7 are activated to output these read data signals GRED0–GRED7, GROD0–GROD7 therefrom. Further, when the test command signal TEST2 is at the low level with the address signal A1 being at the high level, the read data signals GRED0–GRED3, GROD0–GROD3 are outputted from the read amplifiers 13 on the left side of the figure, and when the test command signal TEST2 is at the low level with the address signal A1 being at the low level (that is, with the address signal/A1 being at the high level), the read data signals GRED4–GRED7, GROD4–GROD7 are outputted from the read amplifiers 13 on the right side of the figure.

The read data signals RED, ROD output from the respective switches 35, 36 are supplied to the data outputting circuit 28. The data outputting circuit 28 outputs the data output signal DOUT0.

In the above DDR-SDRAM 1, the read operation of the SDR data compression test proceeds as explained below.

FIG. 10 shows the read timings of data in the SDR data compression test.

The operational circuits 33, 34 shown in FIG. 9 logically operate 8 bits of the read data signals GRED0–GRED7, GROD0–GROD7 and output the detection signals TED, TOD, respectively.

Upon receiving the high level of the test command signal TEST2, the respective switches 35, 36 output the detection signals TED, TOD as the read data signals RED, ROD (at (a) and (b) in FIG. 10).

The data outputting circuit 28 outputs 8 bits of the compressed detection result TOD in the first cycle of the clock signal CLK (at (c) in FIG. 10). Besides, the data outputting circuit 28 outputs 8 bits of the compressed detection result TED in the next cycle of the clock signal CLK (at (d) in FIG. 10).

Accordingly, the read test of the 8-bit data is carried out in one cycle of the clock signal CLK. That is, when notice is taken of the one cycle of the clock signal CLK, the read test of the 8-bit data is performed in the same manner as in the DDR data compression test mode.

The output data latching unit 32 shown in FIG. 9, however, must be formed with very long sixteen wiring lines for the read data signals GRED0–GRED7, GROD0–GROD7. Therefore, the output data latching unit 32 has involved the problems of enlarging a chip size and raising a production cost.

SUMMARY OF THE INVENTION

An object of the present invention is to provide a semiconductor integrated circuit whose sa operation test can be carried out at high speed.

Another object of the present invention is to provide a semiconductor integrated circuit whose testing cost can be reduced.

Still another object of the present invention is to provide a semiconductor integrated circuit which can be shifted into a testing mode with ease.

According to one of the aspects of the semiconductor integrated circuit in the present invention, an input conversion unit converts serial data supplied from the exterior into parallel data. Each of the converted parallel data is respectively written into a plurality of memory cell areas. An output conversion unit converts parallel data constructed by data read from each memory cell area into serial data. That is, data input/output from/to the exterior are performed by means of the serial data, and a data processing in the interior is performed by means of the parallel data.

An operational unit is activated during a testing mode so as to logically operate on the parallel data read from each memory cell area. By writing predetermined data into each memory cell area in advance, it is confirmed by a logic operation that correct data is stored in each memory cell area. The data can be checked simultaneously for the plurality of memory cell areas so that the operation test in the memory cell areas can be carried out at high speed.

According to another aspect of the semiconductor integrated circuit in the present invention, the data of memory cell areas corresponding to a plurality of input/output terminals can be read in an operation test by using a single input/output terminal. Therefore, the number of the testing probes of the testing apparatus necessary for the operation test can be decreased, and the operation test in a large number of semiconductor integrated circuits can be carried out at once. As a result, the testing cost is reduced.

According to another aspect of the semiconductor integrated circuit in the present invention, a plurality of operational units are provided in accordance with the number of input/output terminals, or the layout of memory cell area within a chip. The number of the operational units is determined so as to minimize a chip size and to perform an operation test most efficiently.

According to another aspect of the semiconductor integrated circuit in the present invention, the number of bits which can be tested per unit time can be increased in a data compression test.

According to another aspect of the semiconductor integrated circuit in the present invention, a command controlling unit receives a plurality of command input signals supplied from the exterior, and it determines an operation mode in accordance with the command input signals, so as to output an operation mode control signal. When the command controlling unit receives a predetermined command input, it decides a testing mode as the operation mode and outputs a testing mode control signal TEST1. Therefore, the semiconductor integrated circuit can be readily shifted into the testing mode without providing any dedicated terminal.

According to another aspect of the semiconductor integrated circuit in the present invention, an input conversion unit sequentially accepts serial data supplied from the exterior, twice per cycle of a data strobe signal, and it converts the accepted data into parallel data. Each of the converted parallel data is respectively written into a first memory cell area and a second memory cell area. An output conversion unit converts parallel data constructed by data read from the first and second memory cell area into serial data, and it sequentially outputs the converted serial data twice per cycle of a clock signal.

An operational unit is activated in a testing mode so as to logically operate on the parallel data read from the first and the second memory cell area. The operational unit outputs an operation result at once in synchronization with the clock signal. By writing predetermined data into the first and the second memory cell area in advance, it is confirmed by a logic operation that correct data is stored in the first and the second memory cell area. The data can be checked simultaneously for the first and the second memory cell area so that the operation test in the memory cell areas can be carried out at high speed.

In the semiconductor integrated circuit which outputs data twice per cycle of the clock signal during a normal operation, the operation result of parallel data read from memory cell areas is output at once in synchronization with the clock signal during a testing mode. Therefore, a testing apparatus which is used for reading data in an operation test need not perform a complicated clock control on the semiconductor integrated circuit. In other words, any expensive testing apparatus need not be introduced anew. A testing program can be created by utilizing accumulated know-how. As a result, the testing cost is reduced.

According to another aspect of the semiconductor integrated circuit in the present invention, an input conversion unit converts serial data supplied from the exterior into parallel data. Each of the converted parallel data is respectively written into a plurality of memory cell areas. An output conversion unit converts parallel data constructed by data read from each memory cell area into serial data. That is, data input/output from/to the exterior are performed by means of the serial data, and data processing in the interior are performed by means of the parallel data.

A writing unit is activated in a testing mode so as to simultaneously write the identical data supplied from the exterior into each memory cell area. In a testing mode, therefore, the write operation on data can be performed at high speed.

According to another aspect of the semiconductor integrated circuit in the present invention, data can be written into each memory cell area corresponding to a plurality of input/output terminals, in an operation test by using a single input/output terminal. Therefore, the number of the testing probes of a testing apparatus necessary for the operation test can be decreased, and the operation tests in a large number of semiconductor integrated circuits can be performed at once. As a result, the testing cost is reduced.

According to another aspect of the semiconductor integrated circuit in the present invention, a plurality of writing units are provided in accordance with the number of input/output terminals, or the layout of memory cell areas within a chip. The number of the writing units is determined so as to minimize a chip size and to perform an operation test most efficiently.

According to another aspect of the semiconductor integrated circuit in the present invention, an input conversion unit sequentially accepts serial data supplied from the exterior, twice per cycle of a data strobe signal, and it converts the accepted data into parallel data. Each of the converted parallel data is respectively written into a first memory cell area and a second memory cell area. An output conversion unit converts parallel data constructed by data read from the first and the second memory cell area into serial data, and it sequentially outputs the converted serial data twice per cycle of a clock signal.

A writing unit is activated in a testing mode so as to accept the data supplied from the exterior at once in synchronization with the data strobe signal and to simultaneously write the accepted data into the first and the second memory cell area in synchronization with the clock signal. Therefore, a testing apparatus which is used for writing data in an operation test need not perform a complicated clock control on the semiconductor integrated circuit. That is, any expensive testing apparatus need not be introduced anew. A testing program can be created by utilizing accumulated know-how. As a result, the testing cost is reduced.

DESCRIPTION OF THE PREFERRED EMBODIMENTS

Now, the embodiments of the present invention will be described in detail with reference to the drawings.

Figure 11:
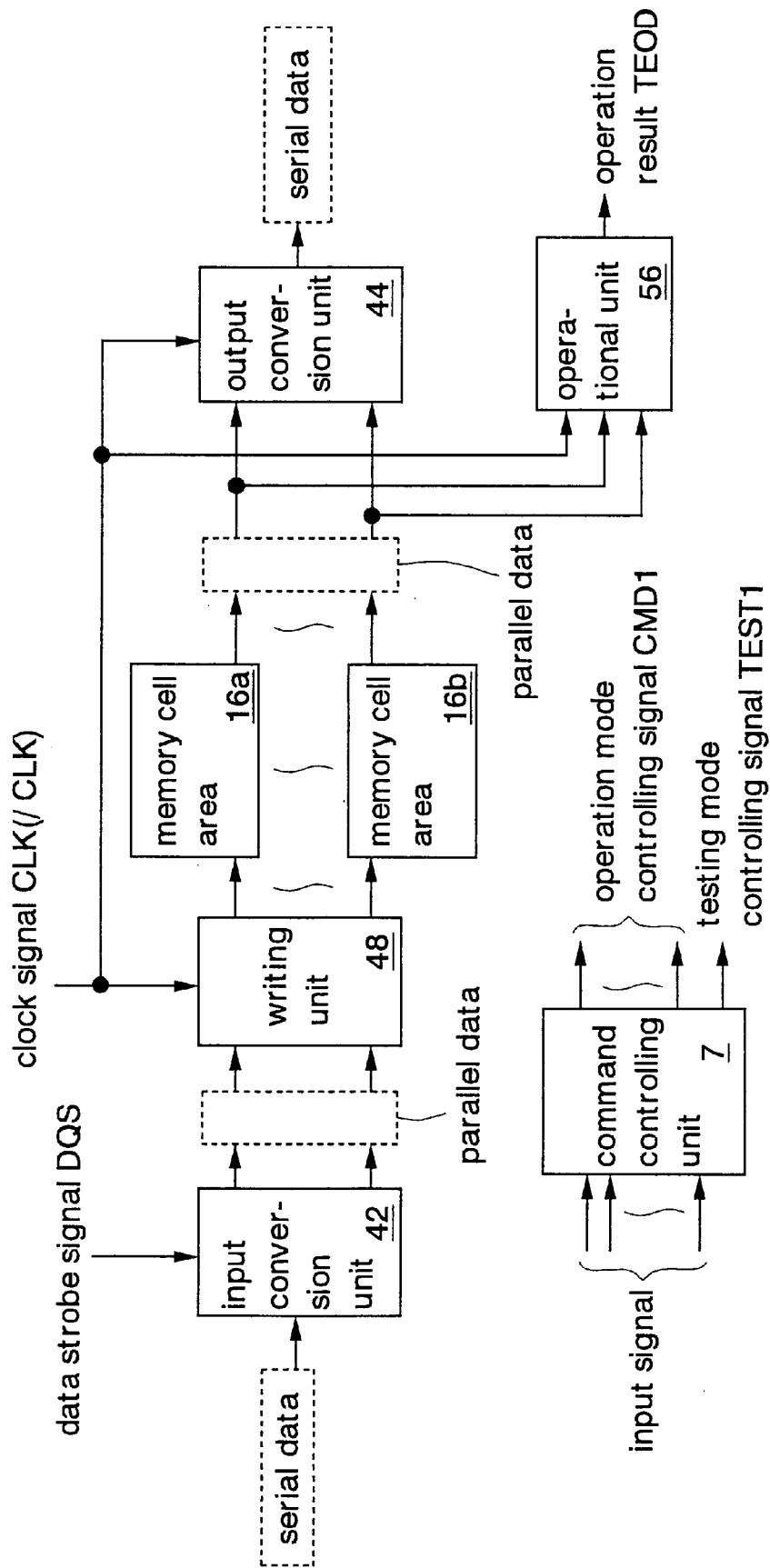
FIG. 11 is a block diagram showing a basic principal of an embodiment of the semiconductor integrated circuit according to the present invention.

FIG. 11 is a block diagram showing the basic principal of an embodiment of a semiconductor integrated circuit according to the present invention.

In the semiconductor integrated circuit, an input conversion unit 42 converts serial data supplied from the exterior into parallel data. Each of the converted parallel data is respectively written into a plurality of memory cell areas 16a, 16b. An output conversion unit 44 converts parallel data constructed by data read from each memory cell area 16a, 16b into serial data. That is, the data input/output from/to the exterior are performed by means of the serial data, and the data processing in the interior are performed by means of the parallel data.

An operational unit 56 is activated during a testing mode so as to logically operate on the parallel data read from each memory cell area 16a, 16b.

A command controlling unit 7 receives a plurality of command input signals supplied from the exterior, and it determines an operation mode in accordance with the command input signals, so as to output an operation mode control signal CMD1.

A writing unit 48 is activated in a testing mode so as to simultaneously write the identical data supplied from the exterior into each memory cell area 16a, 16b.

Figure 12:
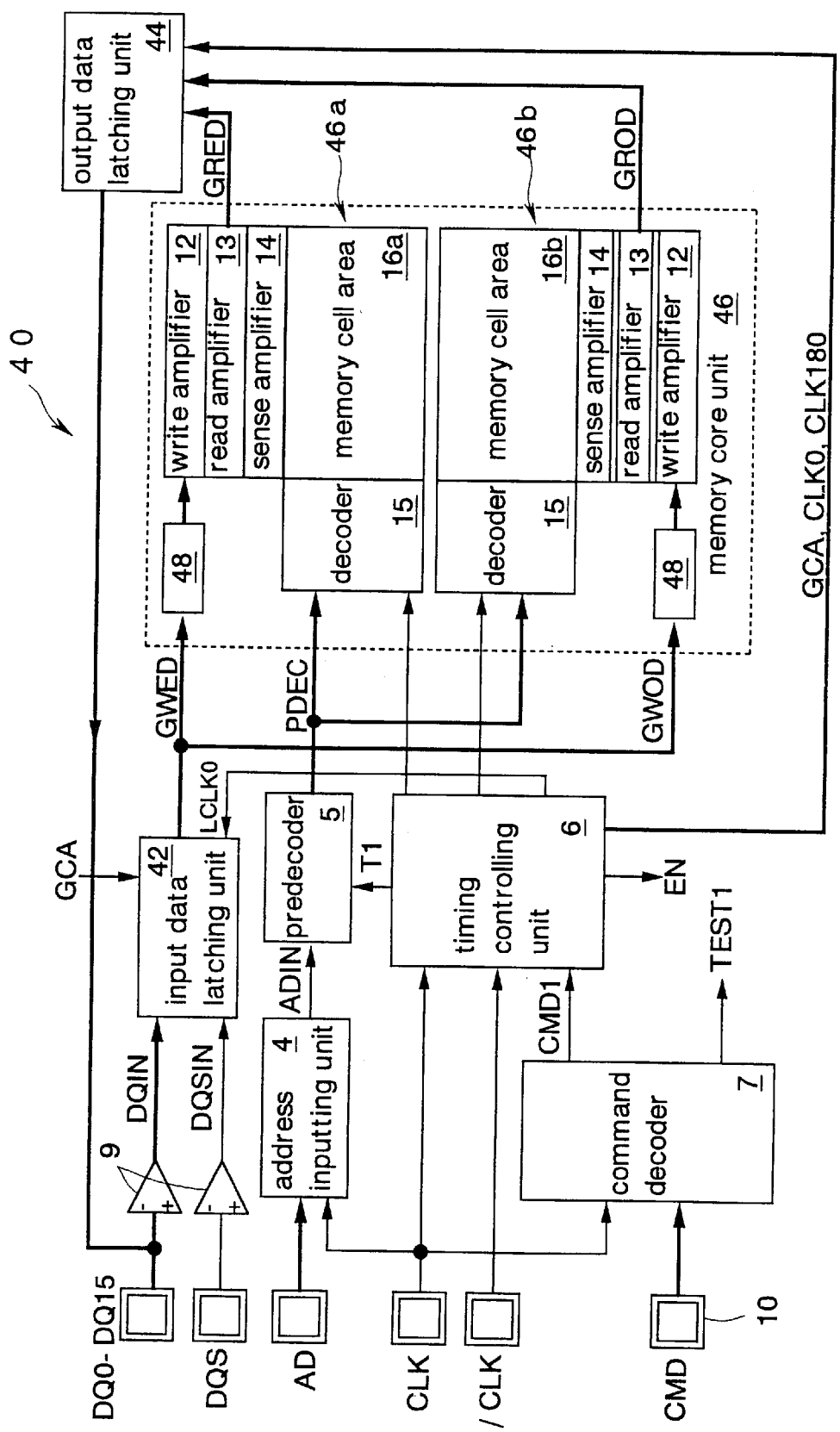
FIG. 12 is a diagram of the whole configuration showing an embodiment of the semiconductor integrated circuit according to the present invention.

FIG. 12 shows one embodiment of the semiconductor integrated circuit according to the present invention.

The semiconductor integrated circuit of this embodiment is formed as a DDR-SDRAM 40 of, for example, 64 Mbits on a silicon substrate by using CMOS process technology. The same circuits as those mentioned in the explanation of the prior art are designated by the same reference numerals and symbols, and they shall be omitted from detailed description. Besides, the same symbols are assigned to the same signals as those mentioned in the explanation of the prior art.

The DDR-SDRAM 40 includes an input data latching unit 42, an output data latching unit 44, an address inputting unit 4, a predecoder 5, a timing controlling unit 6, a command decoder 7, a memory core unit 46, input buffers 9, and pads 10. The input data latching unit 42 corresponds to the input conversion unit (42 shown in FIG. 11), the output data latching unit 44 corresponds to the output conversion unit (44 shown in FIG. 11), and the command decoder 7 corresponds to a command controlling unit (7 shown in FIG. 11). The pad 10 for each data signal DQ is an input/output terminal, and the other pads 10 are input terminals. Incidentally, the DDR-SDRAM 40 has sixteen data signals DQ0–DQ15.

The input data latching unit 42 accepts the data signal DQ and a data strobe signal DQS (as signals DQIN and DQSIN) through the input buffers 9, and outputs write data signals GWED, GWOD. In addition, the input data latching unit 42 receives a data address signal GCA and an internal clock signal LCLK0. This input data latching unit 42 is a circuit by which serial data (the data signals DQ) supplied from the exterior are converted into parallel data (the write data signals GWED, GWOD).

The output data latching unit 44 receives the data address signal GCA and internal clock signals CLK0, CLK180, and it accepts read data signals GRED, GROD from the memory core unit 46, whereupon it outputs the accepted signal as the data signal DQ. This output data latching unit 44 is a circuit by which parallel data (the read data signals GRED, GROD) read out of the memory core unit 46 are converted into serial data (the data signals DQ).

The address inputting unit 4 accepts an address signal AD from the exterior in synchronization with a clock signal CLK, and outputs the accepted signal as an internal address signal ADIN.

The predecoder 5 receives the internal address signal ADIN and a timing signal T1, and outputs a predecoded signal PDEC.

The timing controlling unit 6 receives the clock signal CLK, a clock signal/CLK and a control command signal CMD1, and outputs the internal clock signals CLK0, CLK180, LCLK0, the data address signal GCA, an enable signal EN and the timing signal T1.

The command decoder 7 receives the clock signal CLK and a command signal CMD, and outputs the control command signal CMD1 and a test command signal TEST1. The command signal CMD corresponds to a command input signal. The control command signal CMD1 is an operation mode controlling signal, which controls a write operation, a read operation or the like. The test command signal TEST1 is a test mode controlling signal, which becomes a high level during an SDR data compression test mode to be explained later. Incidentally, the DDR-SDRAM 40 of this embodiment is not furnished with a DDR data compression test mode.

The memory core unit 46 is constructed of an even-numbered core unit 46a and an odd-numbered core unit 46b. Each of the even-numbered core unit 46a and the odd-numbered core unit 46b includes a write controlling circuit 48, a write amplifier 12, a read amplifier 13, a sense amplifier 14, a decoder 15, and a memory cell area 16 having a plurality of memory cells (memory cell areas 16a, 16b corresponding to the respective core units 46a, 46b). The memory cell areas 16a, 16b correspond to the first memory cell area and the second memory cell area, respectively. The write controlling circuit 48 corresponds to a writing unit. The construction and wiring of the DDR-SDRAM 40 except those of the write controlling circuit 48 are the same as in the prior art.

The write controlling circuit 48 is a circuit which transmits the write data signal GWED or GWOD to the write amplifier 12. Further, the write amplifier 12 is a circuit which outputs the write data signal GWED or GWOD to the sense amplifier 14. The write data signals GWED, GWOD correspond to an internal data bus.

Figure 1:
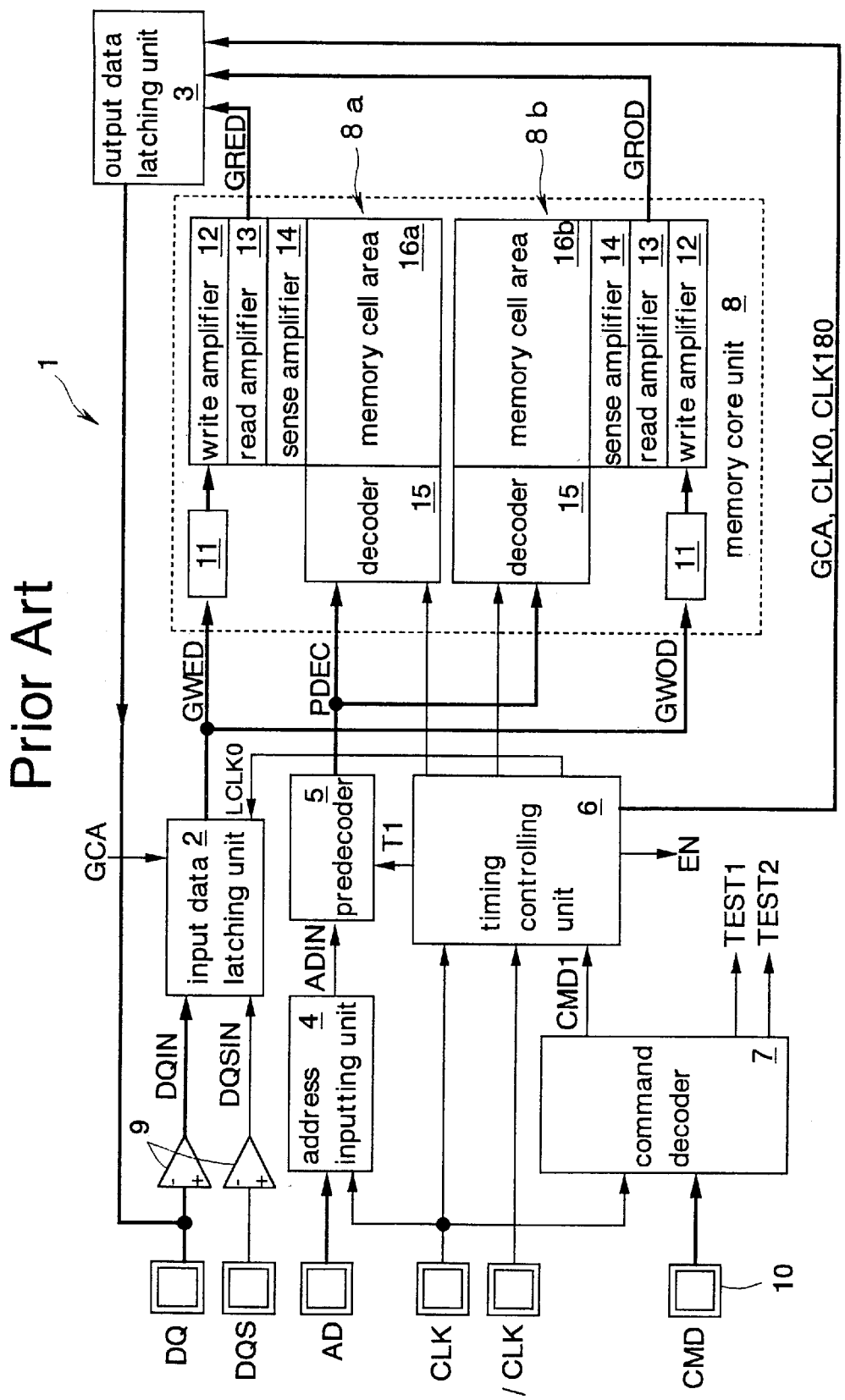
FIG. 1 is a diagram of the whole configuration showing an outline of the prior art DDR-SDRAM.
Figure 2:
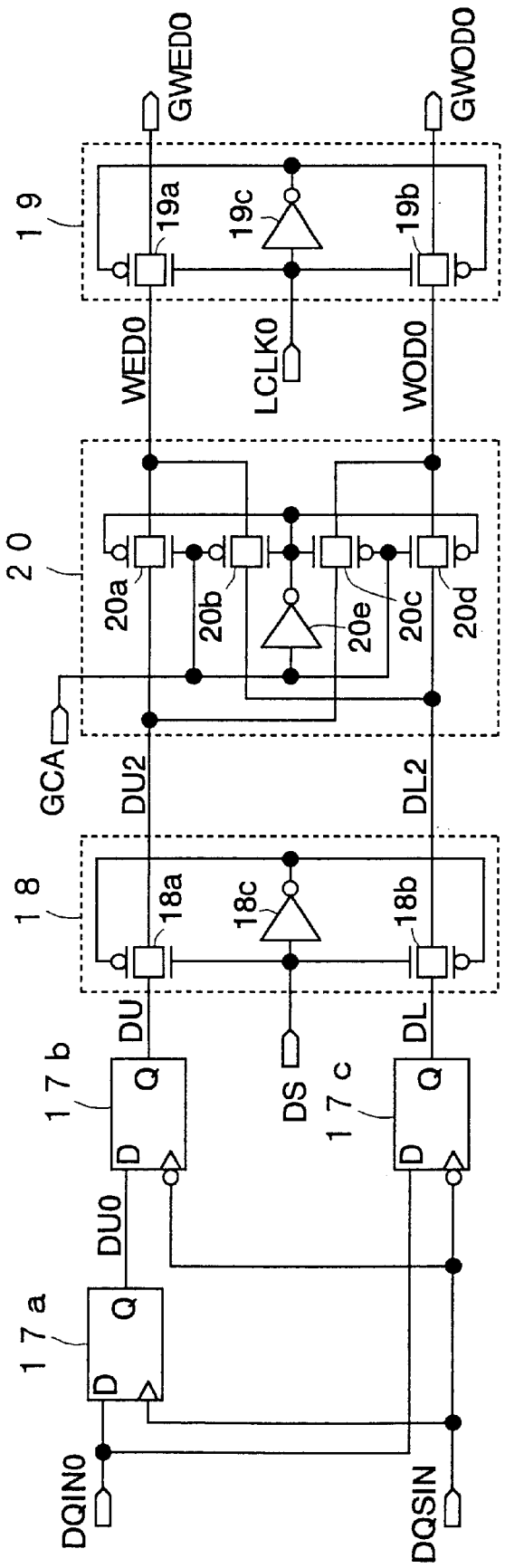
FIG. 2 is a circuit diagram showing the input data latching unit of FIG. 1.
Figure 13:
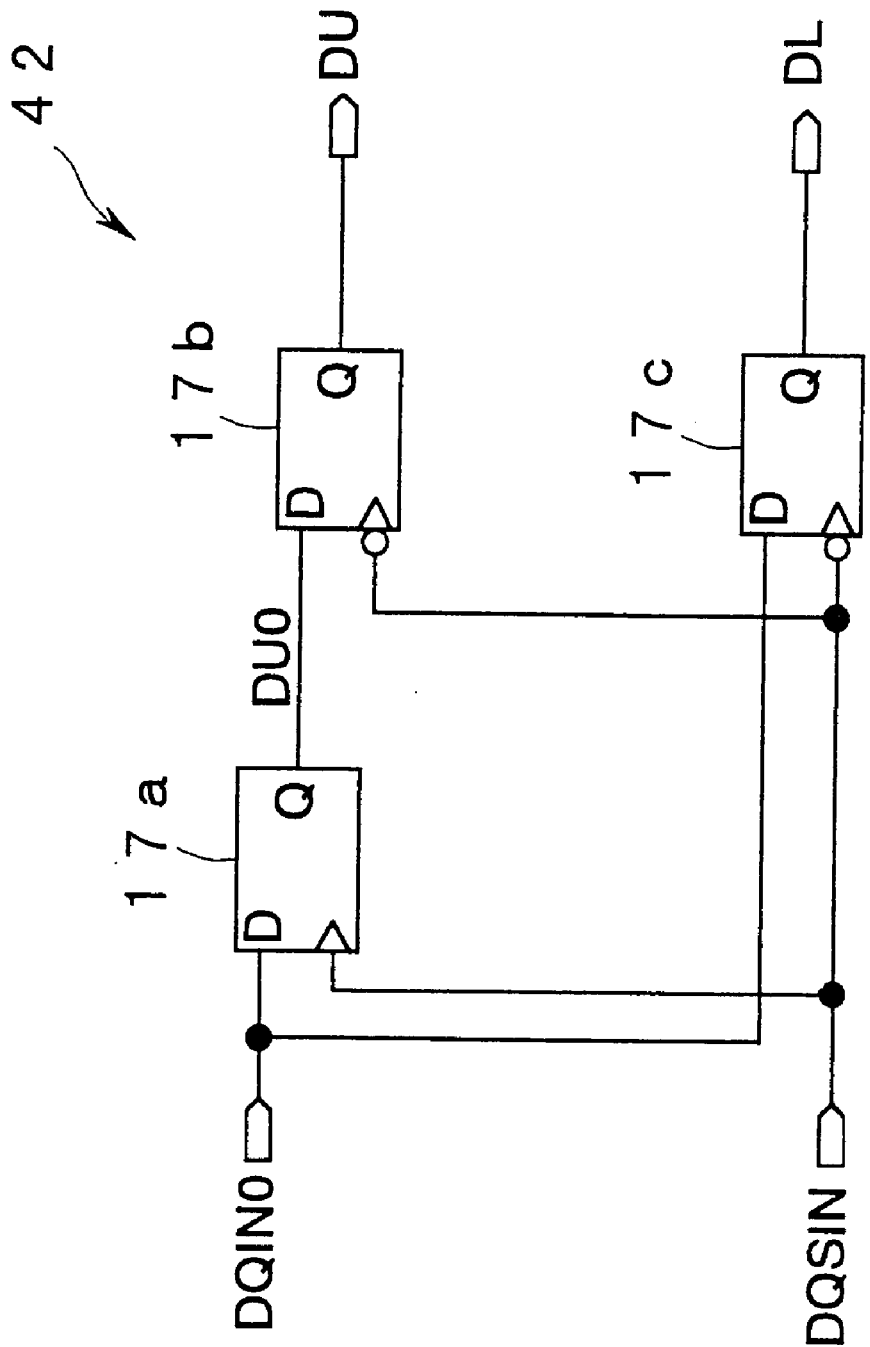
FIG. 13 is a circuit diagram showing a part of the input data latching unit of FIG. 12.
Figure 14:
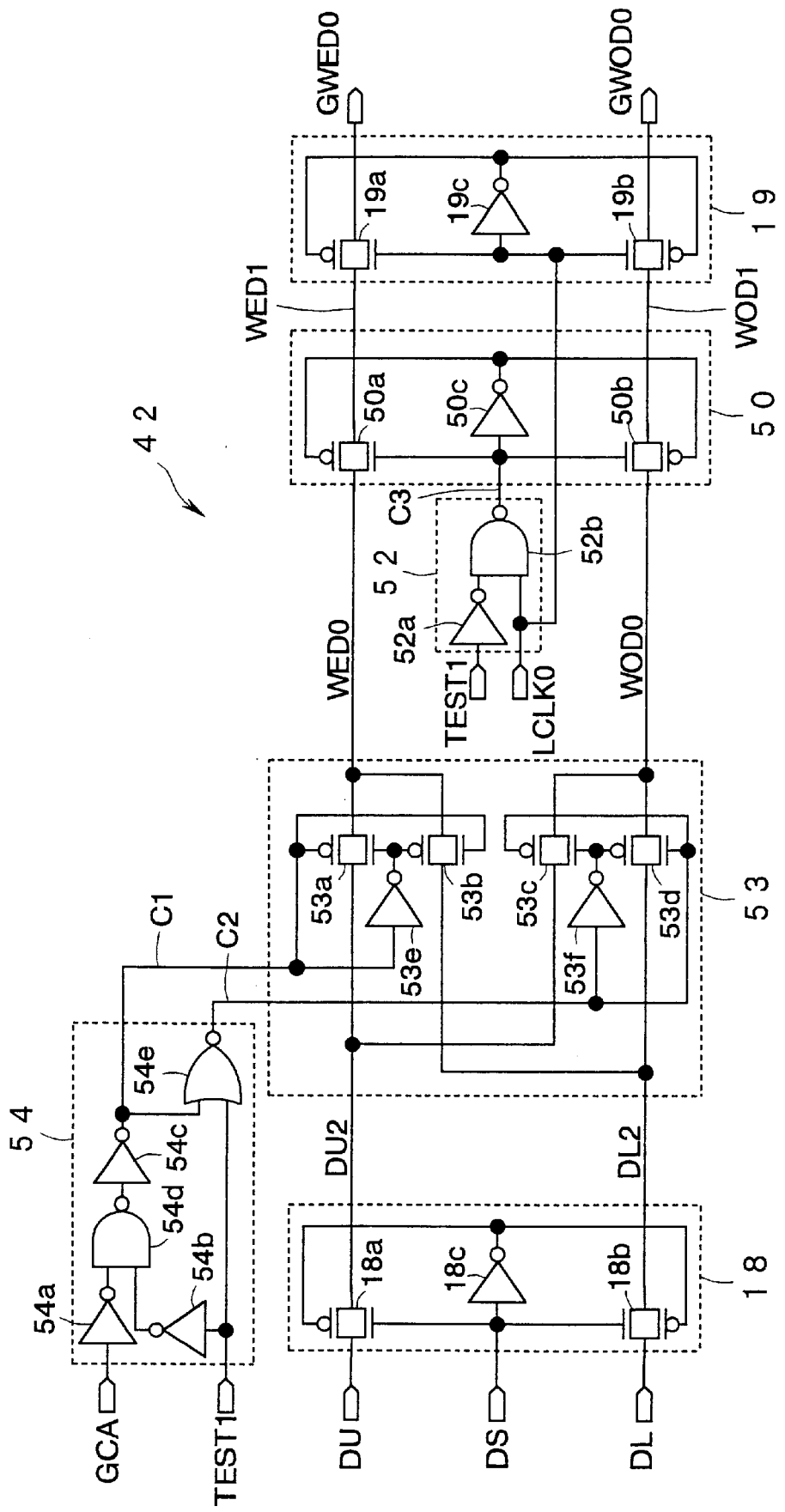
FIG. 14 is a circuit diagram showing a part of the input data latching unit of FIG. 12.

FIGS. 13 and 14 show the input data latching unit 42 for the data signal DQ0. Each of input data latching units for the data signals DQ4, DQ8 and DQ12 is the same as the input data latching unit 42. Each of input data latching units for the data signals DQ1–DQ3, DQ5–DQ7, DQ9–DQ11, and DQ13–DQ15 is the same as the prior-art input data latching unit 2 shown in FIG. 2.

As shown in FIG. 13, the input data latching unit 42 includes flip-flop circuits 17a, 17b, 17c.

The flip-flop circuit 17a accepts an internal data signal DQIN0 in synchronization with the rise of the internal data strobe signal DQSIN, and outputs a write data signal DU0. Subsequently, the flip-flop circuit 17b accepts the write data signal DU0 in synchronization with the fall of the internal data strobe signal DQSIN, and outputs a write data signal DU. Further, the flip-flop circuit 17c accepts the internal data signal DQIN0 in synchronization with the fall of the internal data strobe signal DQSIN, and outputs a write data signal DL.

Besides, as shown in FIG. 14, the input data latching unit 42 includes three transmitting circuits 18, 50, 19, a controlling circuit 52 which controls the transmitting circuit 50, a switching circuit 53, and a controlling circuit 54 which controls the switching circuit 53.

The CMOS transmission gate 18a of the transmitting circuit 18 receives the write data signal DU and outputs a write data signal DU2. On the other hand, the CMOS transmission gate 18b of the transmitting circuit 18 receives the write data signal DL and outputs a write data signal DL2. The input node of the inverter 18c of the transmitting circuit 18 is supplied with an internal data strobe signal DS.

The controlling circuit 54 includes inverters 54a, 54b, 54c, a 2-input NAND gate 54d, and a 2-input NOR gate 54e. The input nodes of the NAND gate 54d receive the inverted signal of the data address signal GCA through the inverter 54a, and the inverted signal of the test command signal TEST1 through the inverter 54b. The output node of the NAND gate 54d is connected to the input node of the inverter 54c. This inverter 54c outputs a control signal C1. The input nodes of the NOR gate 54e receive the control signal C1 and the test command signal TEST1. The NOR gate 54e outputs a control signal C2.

This controlling circuit 54 is a circuit which keeps the control signals C1, C2 at low levels during the SDR data compression test mode, and which outputs the inverted logic of the data address signal GCA as the control signal C1 and also outputs the data address signal GCA as the control signal C2.

The switching circuit 53 includes CMOS transmission gates 53a, 53b, 53c, 53d in each of which the sources and drains of a pMOS and an nMOS are connected to each other, and inverters 53e, 53f. The CMOS transmission gates 53a, 53c receive the write data signal DU2 and outputs the received signal as write data signals WED0, WOD0, respectively. On the other hand, the CMOS transmission gates 53b, 53d receive the write data signal DL2 and outputs the received signal as the write data signals WED0, WOD0, respectively. The gate of the pMOS of the CMOS transmission gate 53a, and that of the nMOS of the CMOS transmission gate 53b receive the control signal C1. Also, the gate of the nMOS of the CMOS transmission gate 53a and that of the pMOS of the CMOS transmission gate 53b receive the inverted signal of the control signal C1 through the inverter 53e. Besides, the gate of the pMOS of the CMOS transmission gate 53c and that of the nMOS of the CMOS transmission gate 53d receive the control signal C2. In addition, the gate of the nMOS of the CMOS transmission gate 53c and that of the pMOS of the CMOS transmission gate 53d receive the inverted signal of the control signal C2 through the inverter 53f.

The controlling circuit 52 includes an inverter 52a, and a 2-input NAND gate 52b. The input nodes of the NAND gate 52b receive the test command signal TEST1 through the inverter 52a, and the internal clock signal LCLK0, respectively. The NAND gate 52b outputs a control signal C3.

This controlling circuit 52 is a circuit which keeps the control signal C3 at a high level during the SDR data compression test mode, and which outputs the control signal C3 as the internal clock signal LCLK0 during the normal operation of the DDR-SDRAM 40.

The transmitting circuit 50 is the same circuit as the transmitting circuit 19. The CMOS transmission gate 50a of the transmitting circuit 50 receives the write data signal WED0 and outputs a write data signal WED1. On the other hand, the CMOS transmission gate 50b of the transmitting circuit 50 receives the write data signal WOD0 and outputs a write data signal WOD1. The input node of the inverter 50c of the transmitting circuit 50 receives the control signal C3.

The CMOS transmission gate 19a of the transmitting circuit 19 receives the write data signal WED1 and outputs a write data signal GWED0. On the other hand, the CMOS transmission gate 19b of the transmitting circuit 19 receives the write data signal WOD1 and outputs a write data signal GWOD0. The input node of the inverter 19c of the transmitting circuit 19 receives the internal clock signal LCLK0.

The transmitting circuit 19 is the same circuit as the transmitting circuit 18.

The gates of the pMOS's of the CMOS transmission gates 19a, 19b receive the inverted signal of the internal clock signal LCLK0 through the inverter 19c. Also, the gates of the nMOS's of the CMOS transmission gates 19a, 19b receive the internal clock signal LCLK0.

Figure 15:
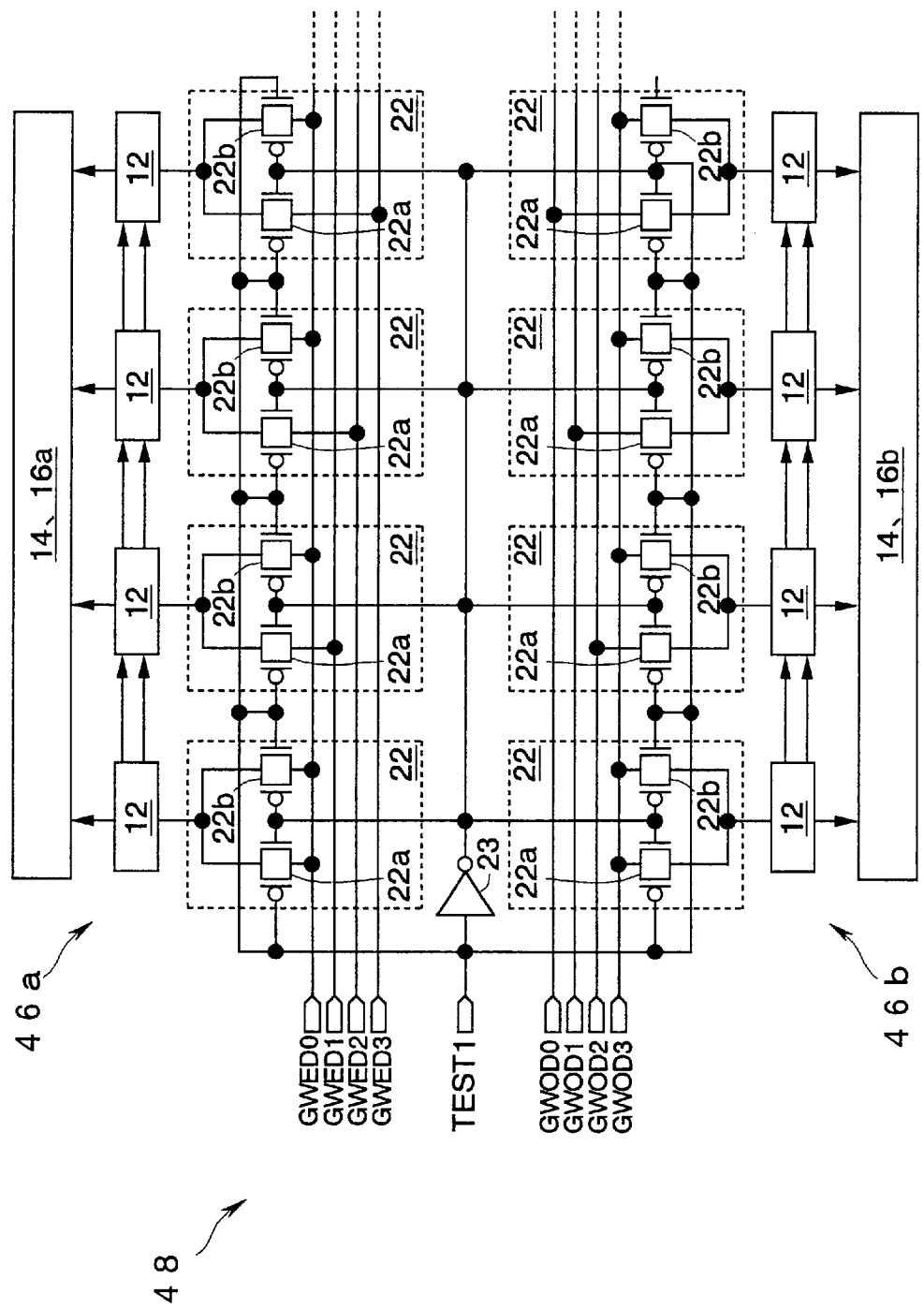
FIG. 15 is a circuit diagram showing the write controlling circuit and the periphery of the FIG. 12.

FIG. 15 shows the write controlling circuit 48 corresponding to the data signals DQ0–DQ3, and the circuits around it. Each of the write controlling circuits corresponding respectively to the data signals DQ4–DQ7, DQ8–DQ11, and DQ12–DQ15 is the same as the write controlling circuit 48.

Figure 3:
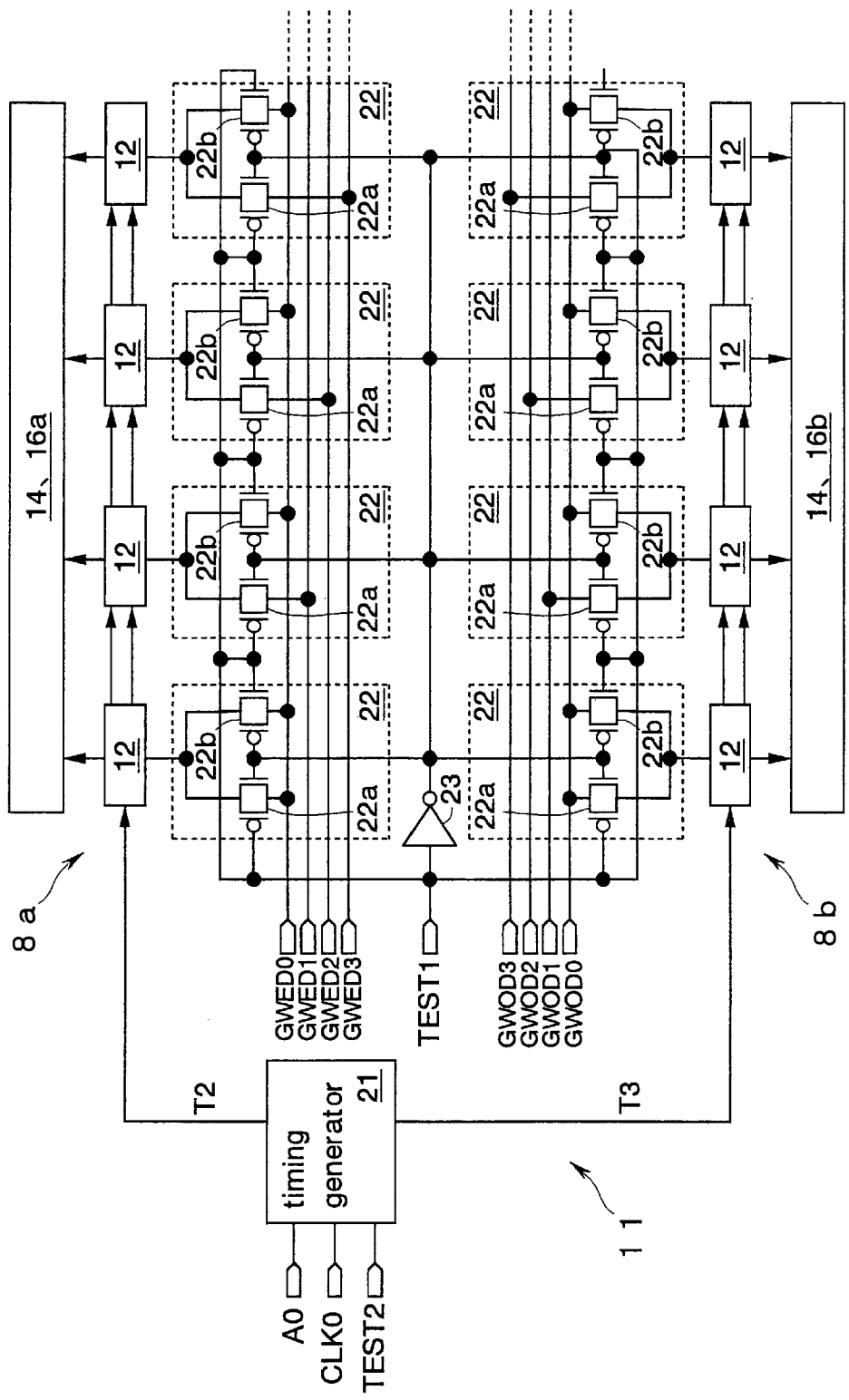
FIG. 3 is a circuit diagram showing the write controlling circuit and the periphery of the FIG. 1.

The write controlling circuit 48 is the same as the write controlling circuit 11 shown in FIG. 3, excepting that the timing generator 21 is omitted.

Figure 16:
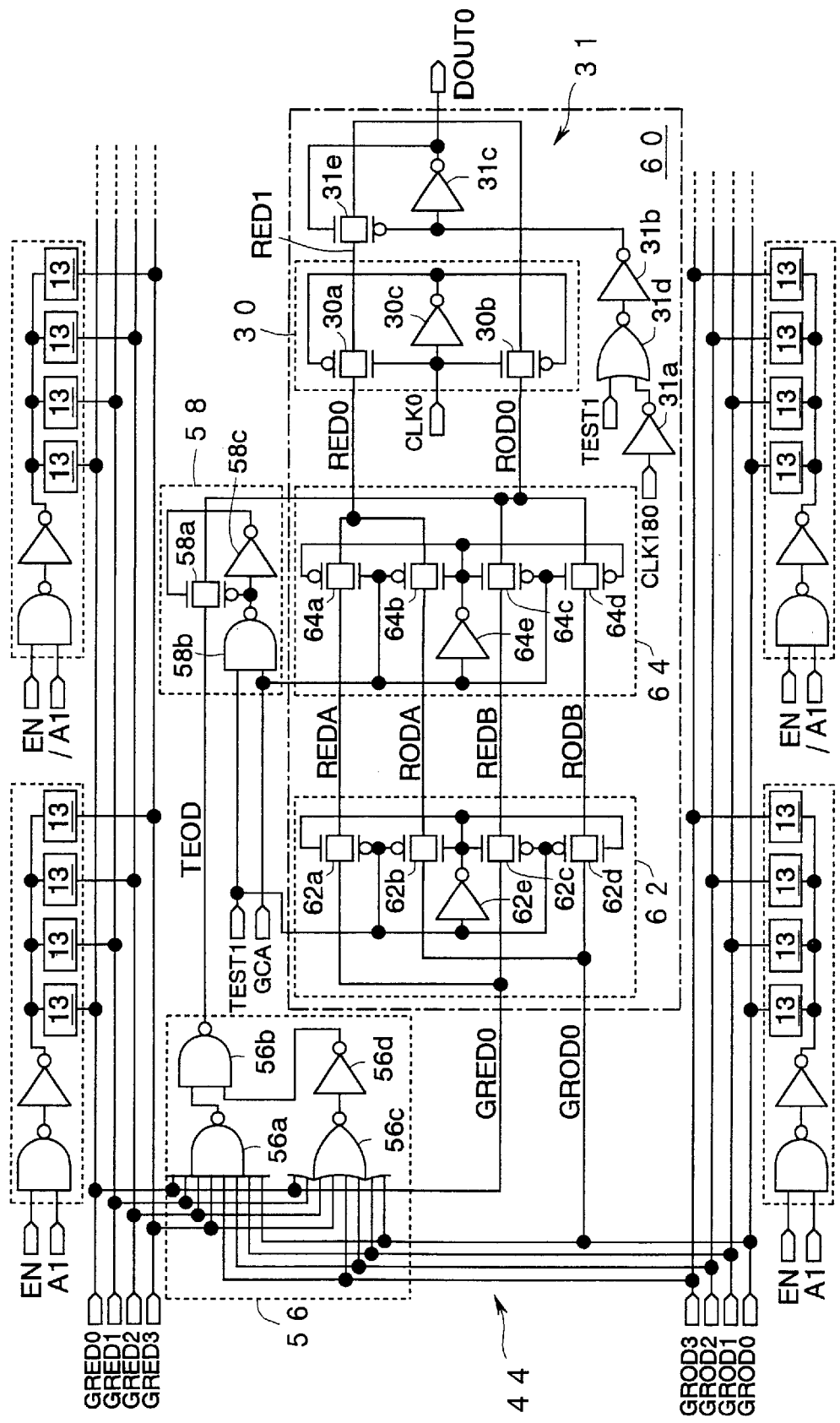
FIG. 16 is a circuit diagram showing the output data latching unit and the periphery of the FIG. 12.

FIG. 16 shows the output data latching unit 44 for the data signal DQ0, and the circuits around it. Each of the output data latching units for the data signals DQ4, DQ8 and DQ12 is the same circuit as the output data latching unit 44. Each of the output data latching units for the data signals DQ1–DQ3, DQ5–DQ7, DQ9–DQ11 and DQ13–DQ15 is the same circuit as in the prior art (the output data latching unit 3 in FIG. 4, in which the read data signals GRED0–GRED3, GROD0–GROD3 are directly supplied to the data outputting circuit 28 as the read data signals RED, ROD).

The output data latching unit 44 is constructed of a logic operational circuit 56, a controlling circuit 58, and a data outputting circuit 60. The operational circuit 56 corresponds to an operational unit(56 in FIG. 11).

The operational circuit 56 includes an 8-input NAND gate 56a, an 8-input NOR gate 56b, an inverter 56c and a 2-input NAND gate 56d. The input nodes of the NAND gate 56a and NOR gate 56b receive the corresponding read data signals GRED0–GRED3 and GROD0–GROD3, respectively. The output node of the NOR gate 56b is connected to the input node of the inverter 56c. Besides, the input nodes of the NAND gate 56d are respectively connected to the output node of the NAND gate 56a and that of the inverter 56c. The NAND gate 56d outputs a detection signal TEOD which is an operation result.

The controlling circuit 58 includes a CMOS transmission gate 58a in which the sources and drains of a pMOS and an nMOS are connected to each other, a 2-input NAND gate 58b and an inverter 58c. The input node of the CMOS transmission gate 58a receives the detection signal TEOD, and the output node thereof outputs a read data signal ROD0. The input nodes of the NAND gate 58b receive the test command signal TEST1 and the data address signal GCA, respectively. Further, the input of the pMOS of the CMOS transmission gate 58a is connected to the output node of the NAND gate 58b. Also, the input node of the nMOS of the CMOS transmission gate 58a receives the inverted logic of the output of the NAND gate 58b through the inverter 58c.

Figure 4:
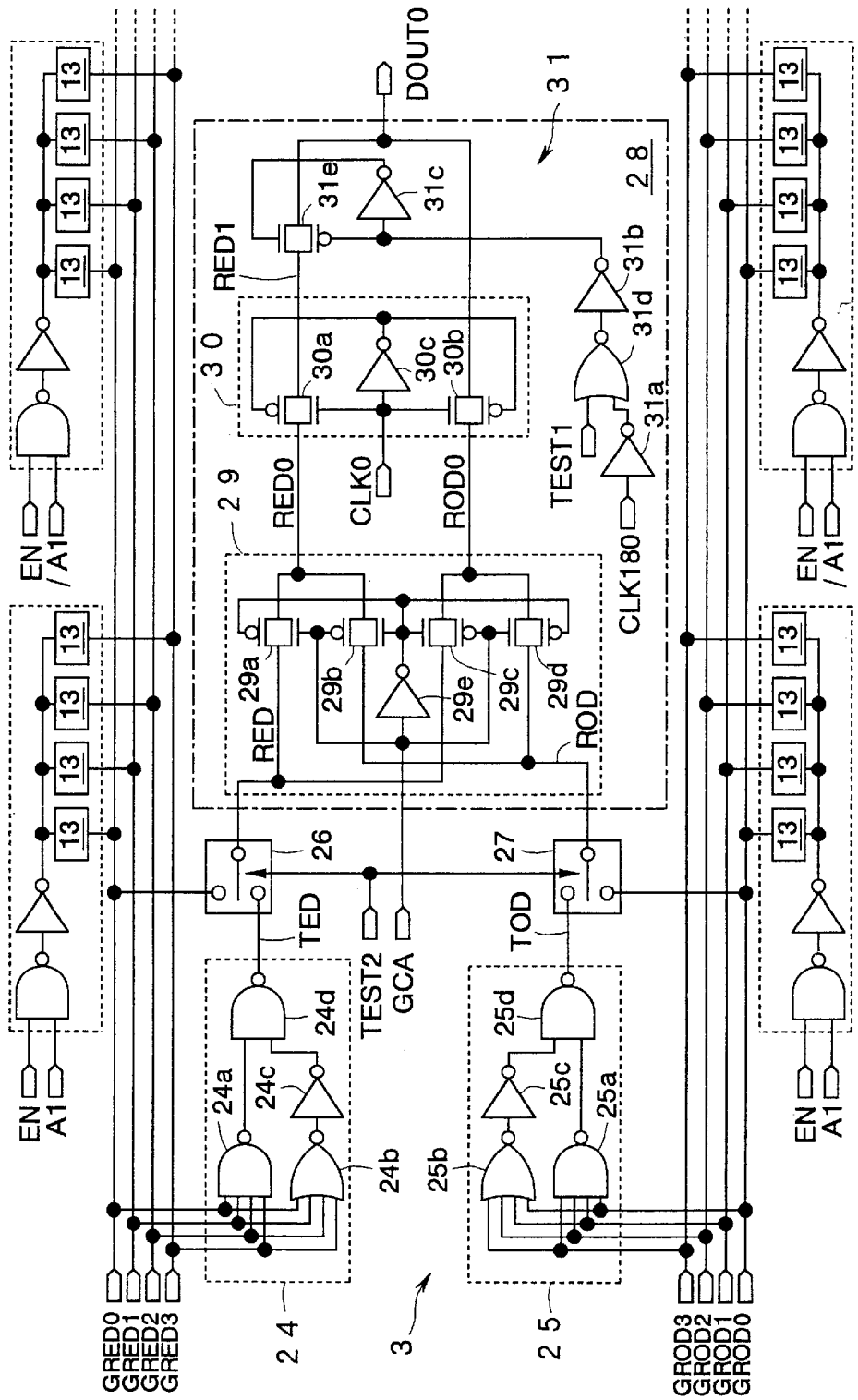
FIG. 4 is a circuit diagram showing the output data latching unit and the periphery of the FIG. 1.
Figure 5:
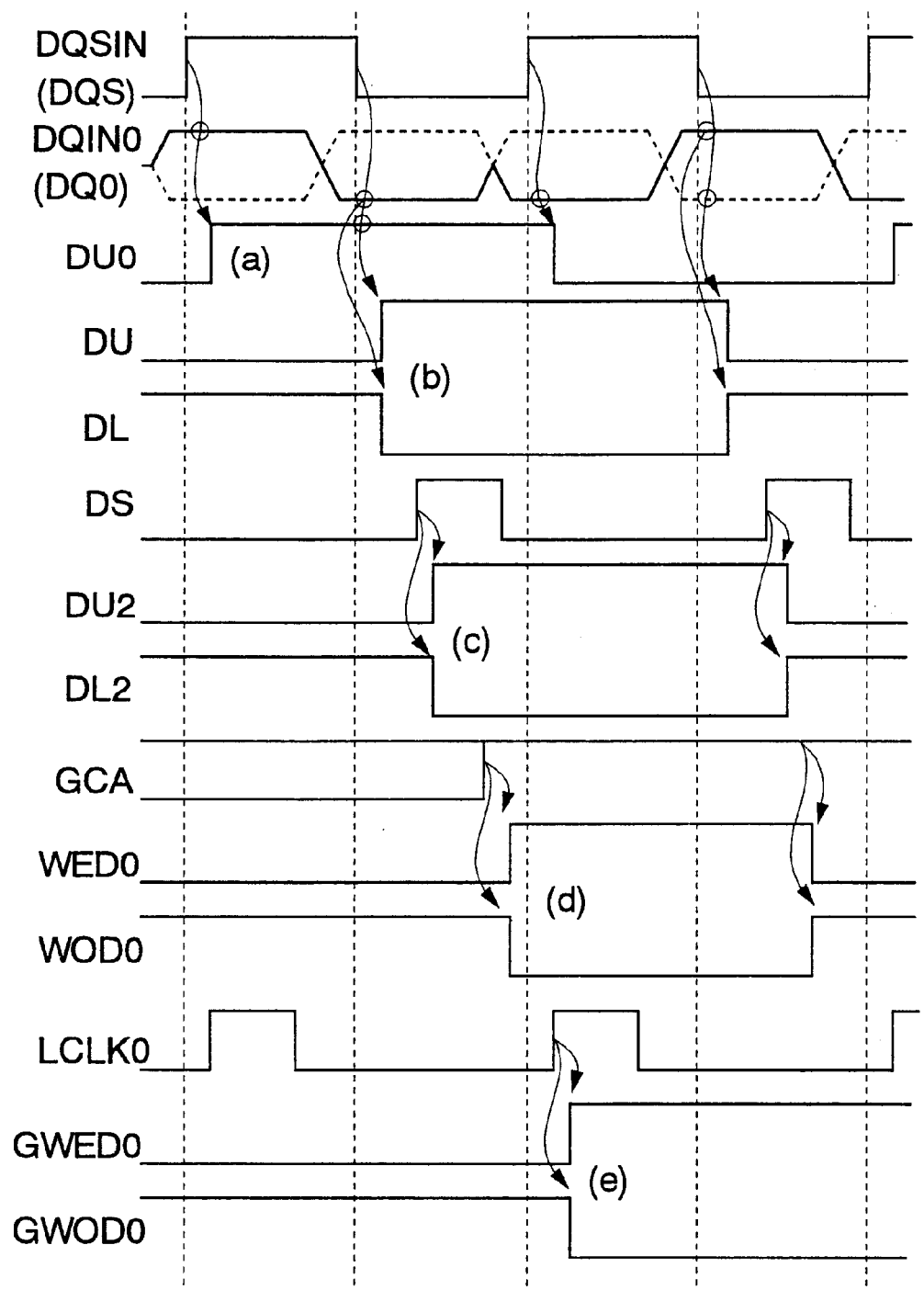
FIG. 5 is a timing chart showing the write operation on data in the prior art DDR data compression test.
Figure 6:
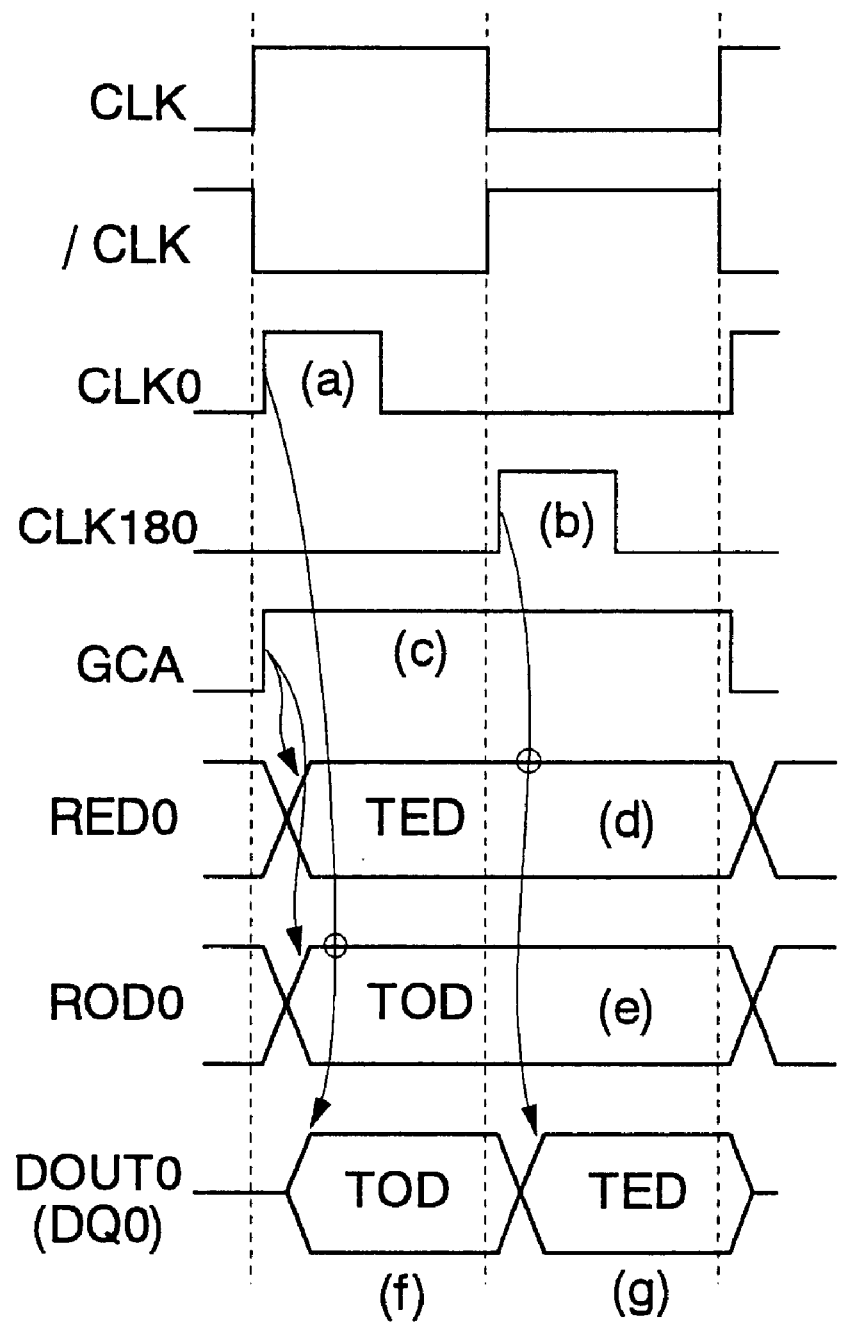
FIG. 6 is a timing chart showing the read operation on data in the prior art DDR data compression test.
Figure 7:
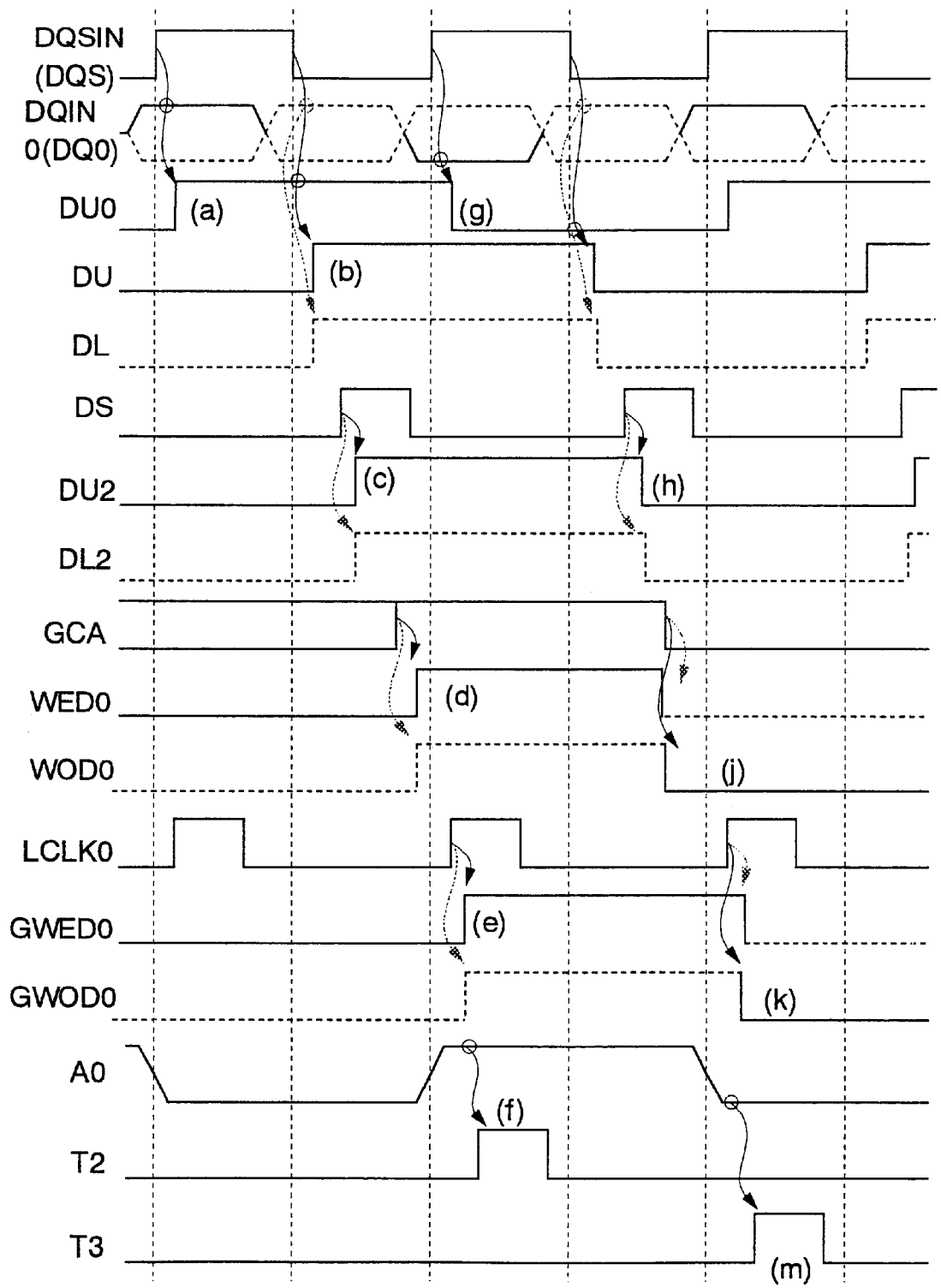
FIG. 7 is a timing chart showing the write operation on data in the prior art SDR data compression test.
Figure 8:
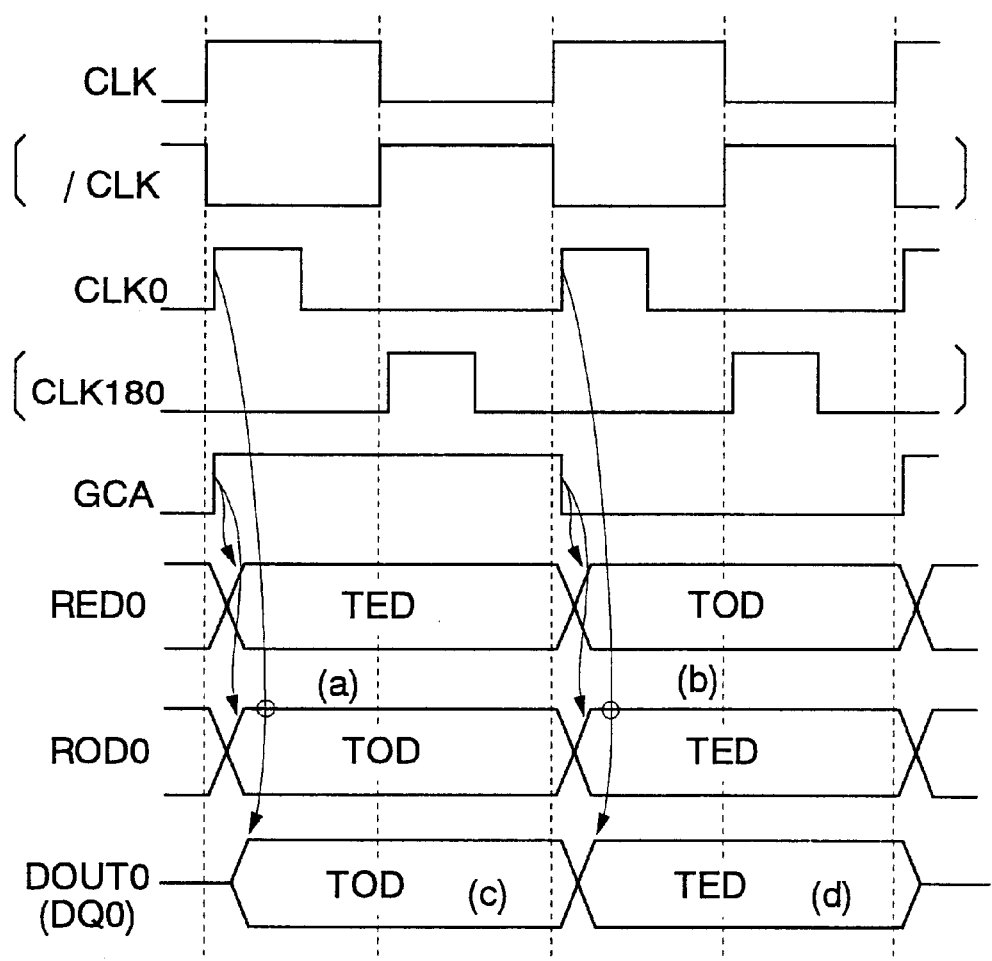
FIG. 8 is a timing chart showing the read operation on data in the prior art SDR data compression test.
Figure 9:
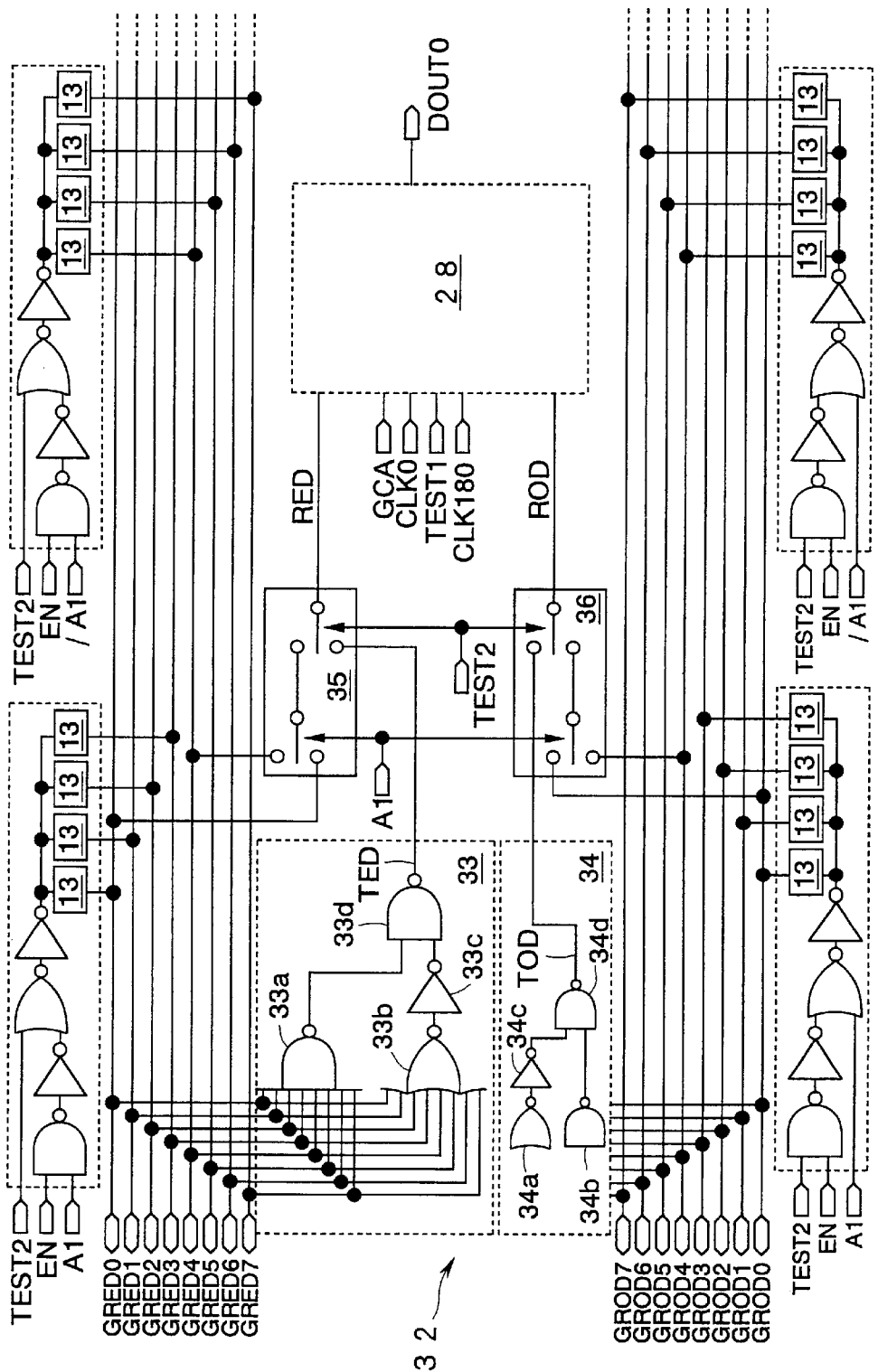
FIG. 9 is a circuit diagram showing another output data latching unit of the prior art and the periphery.
Figure 10:
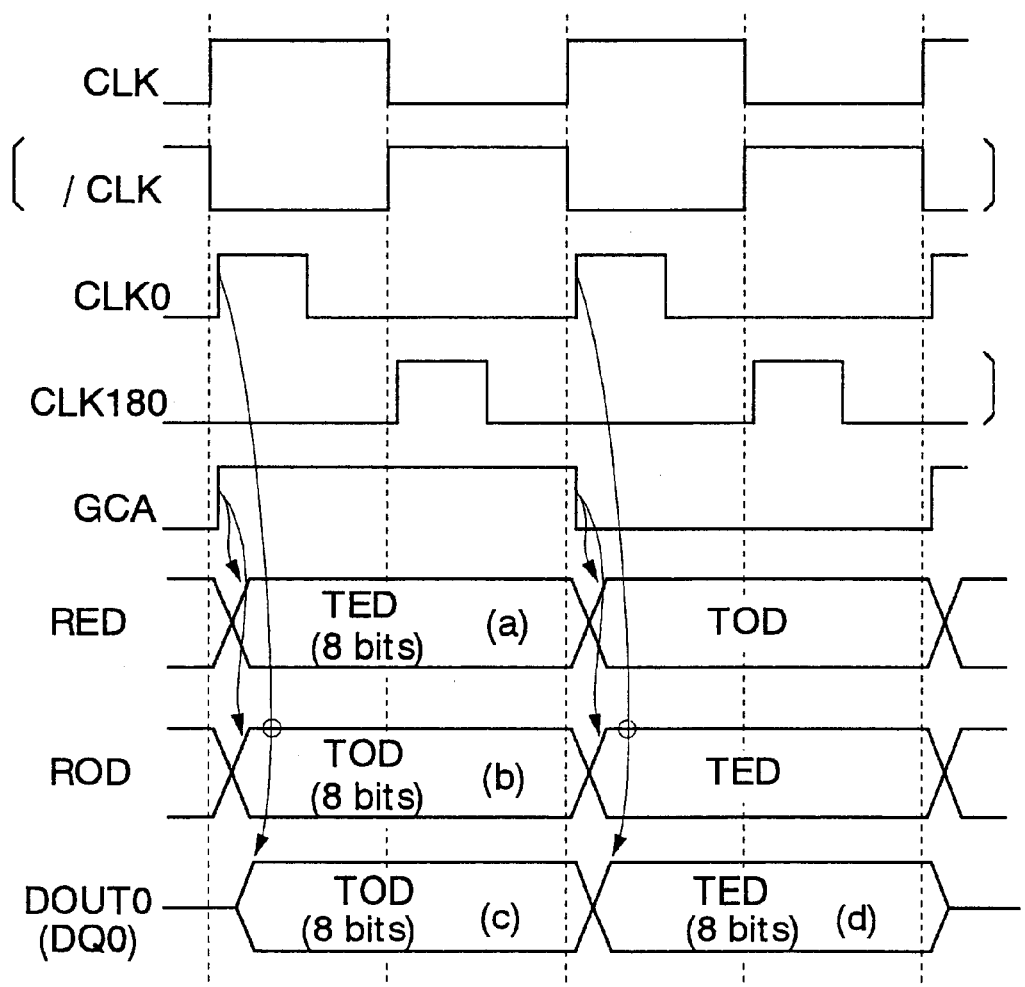
FIG. 10 is a timing chart showing the read operation on data in another SDR data compression test of the prior art.

The data outputting circuit 60 includes a transmitting circuit 62, a selecting circuit 64, a transmitting circuit 30, and a transmitting circuit 32. Each of the transmitting circuits 30, 31 is the same circuit as shown in FIG. 4.

The transmitting circuit 62 includes CMOS transmission gates 62a, 62b, 62c, 62d in each of which the sources and drains of a pMOS and an nMOS are connected to each other, and an inverter 62e. The CMOS transmission gates 62a, 62c receive the read data signal GRED0, and outputs the received signals as read data signals REDA, REDB, respectively. Likewise, the CMOS transmission gates 62b, 62d receive the read data signal GROD0, and outputs the received signal as read data signals RODA, RODB, respectively. The gates of the pMOS 's of the CMOS transmission gates 62a, 62b, 62c, 62d receive the test command signal TEST1. On the other hand, the gates of the nMOS's of the CMOS transmission gates 62a, 62b, 62c, 62d receive the inverted signal of the test command signal TEST1 through the inverter 62e.

The selecting circuit 64 includes CMOS transmission gates 64a, 64b, 64c, 64d in each of which the sources and drains of a pMOS and an nMOS are connected to each other, and an inverter 64e. The CMOS transmission gate 64a receives the read data signal REDA, and output the received signal as a read data signal RED0. Besides, the CMOS transmission gate 64b receives the read data signal RODA, and it outputs the received signal as the read data signal RED0. In addition, the CMOS transmission gate 64c receives the read data signal REDB, and it outputs the received signal as the read data signal ROD0. Further, the CMOS transmission gate 64d receives the read data signal RODB, and outputs the received signal as the read data signal ROD0. The gates of the pMOS's of the CMOS transmission gates 64a, 64d and those of the nMOS's of the CMOS transmission gates 64b, 64c receive the inverted signal of the data address signal GCA through the inverter 64e. The gates of the nMOS's of the CMOS transmission gates 64a, 64d and those of the pMOS's of the CMOS transmission gates 64b, 64c receive the data address signal GCA.

The CMOS transmission gate 30a of the transmitting circuit 30 receives the read data signal RED0, and outputs a read data signal RED1. Besides, the CMOS transmission gate 30b of the transmitting circuit 30 receives the read data signal ROD0, and outputs a data output signal DOUT0. Further, the input node of the inverter 30c of the transmitting circuit 30 receives the internal clock signal CLK0.

The respective input nodes of the NOR gate 31d of the transmitting circuit 31 receive the test command signal TEST1, and the inverted signal of the clock signal CLK180 as produced through an inverter 31a. The gate of the pMOS of the CMOS transmission gate 31e of the transmitting circuit 31 is connected to the output node of the NOR gate 31d through an inverter 31b. Further, the gate of the nMOS of the CMOS transmission gate 31e is connected to the output node of the inverter 31b through an inverter 31c. Besides, the input node of the CMOS transmission gate 31e receives the read data signal RED1. The output node of the CMOS transmission gate 31e outputs the read data signal DOUT0.

The connectional relations between the read data signals GRED0–GRED3, GROD0–GROD3 and the read amplifiers 13 are the same as shown in FIG. 4. More specifically, the four read amplifiers 13 on the left side of FIG. 16 receive a signal which has been obtained by taking the AND logic of the enable signal EN and an address signal A1. On the other hand, the four read amplifiers 13 on the right side of the figure receive a signal which has been obtained by taking the AND logic between the enable signal EN and an address signal/A1.

In the above DDR-SDRAM 40, the SDR data compression test proceeds as explained below. Upon receiving the command signal CMD supplied from the exterior, the DDR-SDRAM 40 shifts into the testing mode. On this occasion, the DDR-SDRAM 40 brings the test command signal TEST1 at the high level.

Figure 17:
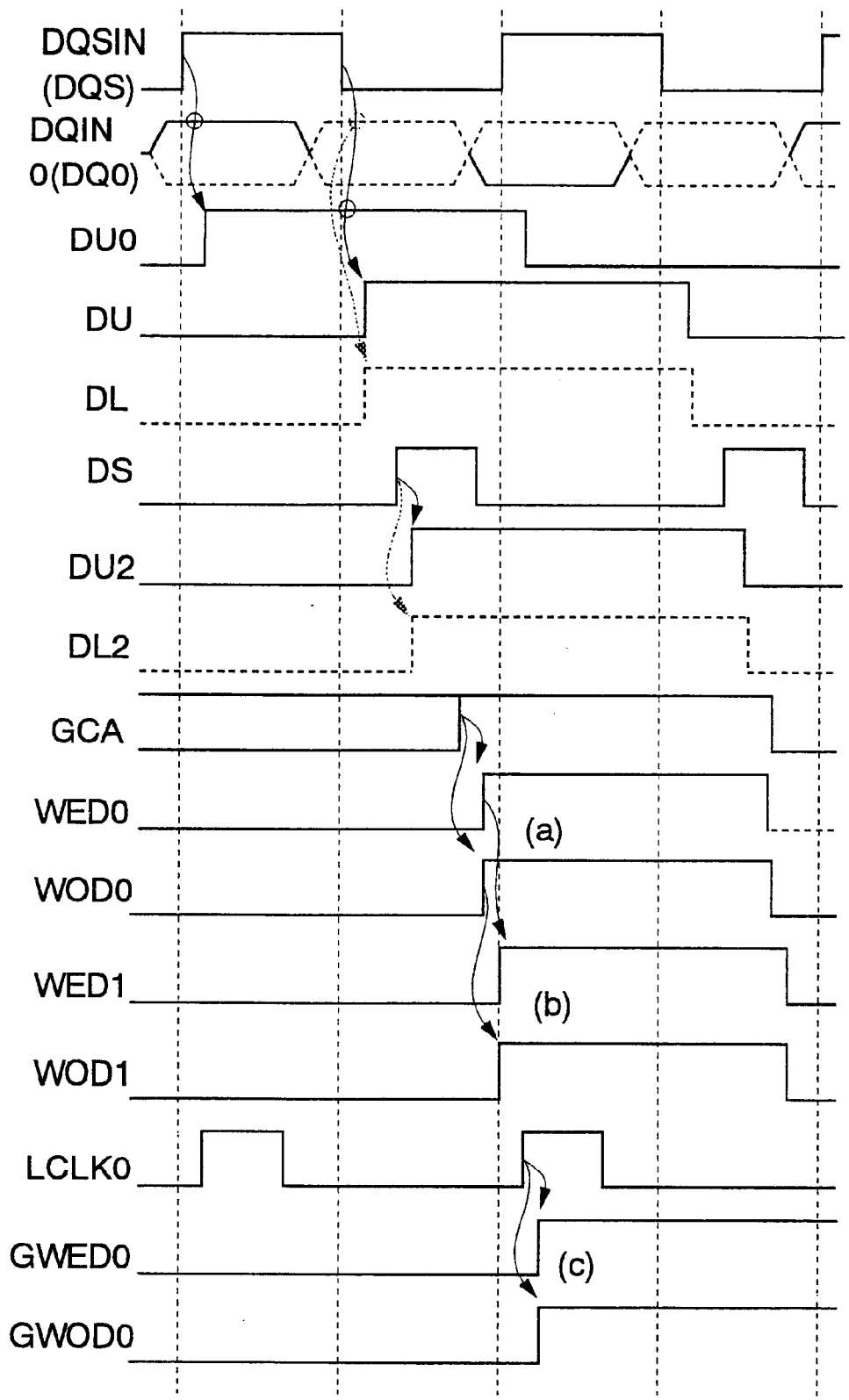
FIG. 17 is a timing chart showing the write operation on data in the data compression test.

FIG. 17 shows the write timings of data in the SDR data compression test. The write timings of and before the timing of the write data signal DU outputted by the transmitting circuit 18 shown in FIG. 14 are the same as in the prior art, and shall be therefore omitted from description.

Upon receiving the high level of the test command signal TEST1, the controlling circuit 54 brings the control signal C1 to the low level and the control signal C2 to the high level.

Upon receiving the low level of the control signal C1, the switching circuit 53 turns on the CMOS transmission gate 53a and turns off the CMOS transmission gate 53b. Besides, upon receiving the high level of the control signal C2, the switching circuit 53 turns on the CMOS transmission gate 53c and turns off the CMOS transmission gate 53d. Therefore, the switching circuit 53 outputs the write data signal DU2 as the write data signals WED0, WOD0 (at (a) in FIG. 17).

Incidentally, during the normal operation of the DDR-SDRAM 40, the test command signal TEST1 is kept at the low level. Consequently, the controlling circuit 54 outputs the inverted logic of the data address signal GCA as the control signal C1 and also outputs the data address signal GCA as the control signal C2. As a result, the switching circuit 53 performs the same operation as that of the switching circuit 20 shown in FIG. 2.

Upon receiving the high level of the test command signal TEST1, the controlling circuit 52 brings the control signal C3 to the high level. The transmitting circuit 50 having received the high level of the control signal C3, turns on the CMOS transmission gates 50a, 50b, thereby to output the respective write data signals WED0, WOD0 as the write data signals WED1, WOD1 (at (b) in FIG. 17).

Upon receiving the high level of the internal clock signal LCLK0, the transmitting circuit 19 outputs the respective write data signals WED1, WOD1 as the write data signals GWED0, GWOD0 (at (c) in FIG. 17).

When each of the switching circuits 22 shown in FIG. 15 has received the high level of the test command signal TEST1, it turns on the CMOS transmission gate 22b and turns off the CMOS transmission gate 22a.

Each of the write amplifiers 12 receives the corresponding write data signal GWED0 or GWOD0 through the CMOS transmission gate 22b, and writes the received data signal GWED0 or GWOD0 into the corresponding memory cell area 16a or 16b. Therefore, the data signal DQ0 is written into the memory cell areas 16a and 16b (as the data signals DQ0–DQ3) in one cycle of the data strobe signal DQS.

Figure 18:
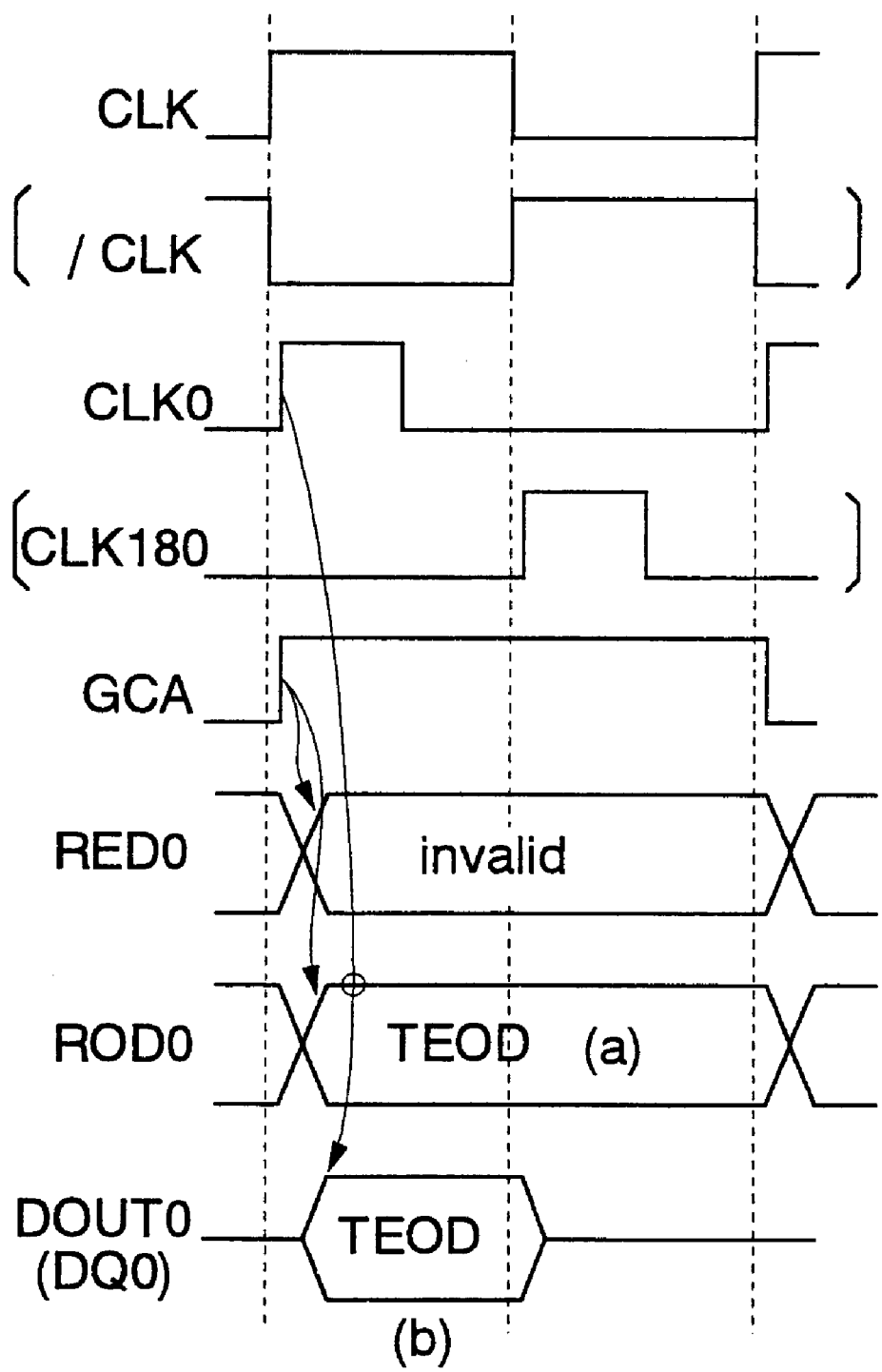
FIG. 18 is a timing chart showing the read operation on data in the data compression test.

FIG. 18 shows the read timings of data in the data compression test.

The transmitting circuit 62 shown in FIG. 16 turns off all the CMOS transmission gates 62a, 62b, 62c, 62d. Therefore, the write data is not transmitted to any of the CMOS transmission gates 64a, 64b, 64c, 64d of the selecting circuit 64.

Upon receiving the high level of the data address signal GCA, the CMOS transmission gate 58a of the controlling circuit 58 outputs the detection signal TEOD as the read data signal ROD0 (at (a) in FIG. 18). On this occasion, the write data is not transmitted to the selecting circuit 64, and hence, the read data signal RED0 is invalid.

Upon receiving the high level of the internal clock signal CLK0, the CMOS transmission gate 30b of the transmitting circuit 30 outputs the read data signal ROD0 being the detection signal TEOD, as the data output signal DOUT0 (at (b) in FIG. 18). On this occasion, the transmitting circuit 31 receives the high level of the test command signal TEST1, and it normally turns off the CMOS transmission gate 31e.

Accordingly, the detection signal TEOD, into which 8-bit data corresponding to the read data signals GRED0–GRED3 from the even-numbered core unit 46a and the read data signals GROD0–GROD3 from the odd-numbered core unit 46b have been compressed, is outputted in one cycle of the clock signal CLK, and the read test of the 8-bit data is performed.

Incidentally, during the normal operation, the test command signal TEST1 is kept at the low level. Accordingly, all the CMOS transmission gates 62a, 62b, 62c, 62d of the transmitting circuit 62 are kept turned on. In contrast, the CMOS transmission gate 58a of the controlling circuit 58 is kept turned off. Therefore, the read data signals GRED0, GROD0 are respectively output as the read data signals RED0, ROD0 from the selecting circuit 64, depending upon the signal level of the data address signal GCA. Subsequently, the respective read data signals ROD0, RED0 are successively outputted as the data signal DQ0 in synchronization with the rises of the clock signals CLK,/CLK.

The semiconductor integrated circuit constructed as described above is provided with the switching circuit 53 which outputs the write data signal DU2 as the write data signal GWED0 of the even-numbered core unit 46a and the write data signal GWOD0 of the odd-numbered core unit 46b in the testing mode. Therefore, the data signal DQ0 supplied from the exterior can be written into the plurality of bits of each of the memory cell areas 16a, 16b at one time in one cycle of the data strobe signal DQS. Accordingly, the operation test can be carried out at the same write rate as that of the DDR data compression test mode by using the testing apparatus for the prior-art SDRAM. Moreover, the timing generator 21 (shown in FIG. 3) can be taken away in the write controlling circuit 48, so that the chip size of the DDR-SDRAM 40 can be reduced.

The DDR-SDRAM 40 is provided with the output data latching unit 46 which corresponds to the data signals DQ0, DQ4, DQ8, DQ12. Therefore, the 4-bit data of the data signals DQ0, DQ4, DQ8, DQ12 can be written into the 16 bits of each of the even-numbered core unit 46a and the odd-numbered core unit 46b. Accordingly, the number of write bits per clock cycle can be enlarged.

The operational circuit 56 is provided for logically operating the read data signals GRED0–GRED3, GROD0–GROD3 and outputting the operation result as the detection signal TEOD. In the testing mode, therefore, the 8-bit data read out of the memory cell areas 16a, 16b can be compressed into the detection signal TEOD so as to be read at one time in one cycle of the clock signal CLK. Accordingly, the operation test can be carried out at the same read rate as that of the DDR data compression test mode by using the testing apparatus for the prior-art SDRAM.

As a result, it is dispensed with to introduce any expensive testing apparatus anew. A testing program can be created by utilizing accumulated know-how.

Moreover, the number of the testing probes of the testing apparatus necessary for the operation test can be decreased, and a large number of DDR-SDRAM's 40 can be mounted on an evaluating board so as to perform the operation tests thereof at one time.

The operational circuit 56 is provided in correspondence with the data signals DQ0, DQ4, DQ8, DQ12. Therefore, the 16-bit data of the even-numbered core unit 46a and odd-numbered core unit 46b can be compressed into 4-bit data so as to perform the operation test. Accordingly, the number of test bits per clock cycle can be enlarged.

The command decoder 7 is provided for receiving the command signal CMD and outputting the test command signal TEST1. Therefore, the DDR-SDRAM 40 can readily shift into the SDR data compression test mode without forming any dedicated testing probe.

With the semiconductor integrated circuit of the present invention described above, the testing cost can be sharply reduced.

Incidentally, the foregoing embodiment has been described on the example in which the present invention is applied to the DDR-SDRAM. The present invention, however, is not restricted to such an embodiment. By way of example, the present invention may well be applied to a system LSI which implements a memory core conforming to DDR-SDRAM specifications. Besides, the present invention may well be applied to a semiconductor memory in which data are read/written four times in one clock cycle.

Further, the foregoing embodiment has been described on the example in which the test is performed by compressing 8 bits of the read data signals GRED0–GRED3, GROD0–GROD3 into one bit. The present invention, however, is not restricted to such an embodiment. By way of example, a test may well be performed by compressing 16 bits of the read data signals GRED0–GRED7, GROD0–GROD7 into one bit.

Still further, the foregoing embodiment has been described on the example in which the present invention is applied to the "1–0 testing mode method" where the detection signal TEOD becomes the low level in the presence of erroneous read data. The present invention, however, is not restricted to such an embodiment. By way of example, the present invention may well be applied to the "1–0 Hi-Z testing mode method" where a detection signal becomes a high impedance in the presence of erroneous read data.

The invention is not limited to the above embodiments and various modifications are possible without departing from the spirit and scope of the invention. Any improvements may be made in part or all of the components.

What is claimed is:

1. A semiconductor integrated circuit comprising:
   an input conversion unit which converts serial data supplied from the exterior into parallel data;
   a plurality of memory cell areas which is respectively written each of said parallel data;
   an output conversion unit which converts parallel data constructed by data read from each said memory cell area into serial data; and
   an operational unit which performs during a testing mode a logic operation on said parallel data read from each said memory cell area.

2. A semiconductor integrated circuit according to claim 1, wherein said operational unit logically operates on the data corresponding to a plurality of input/output terminals which is read from each said memory cell areas, and outputs the operation result from one of said input/output terminals.

3. A semiconductor integrated circuit according to claim 2, comprising a plurality of said operational units.

4. A semiconductor integrated circuit according to claim 2, wherein said testing mode is a data compression test mode which compresses together data in an internal data bus corresponding to each said input/output terminal and performs an operation test.

5. A semiconductor integrated circuit according to claim 1, comprising a command controlling unit which receives a plurality of command input signals which is supplied from the exterior, and determines a operation mode; and
   wherein said operation mode shifts to said testing mode based on said command input.

6. A semiconductor integrated circuit comprising:
   an input conversion unit which sequentially accepts, twice per cycle of a data strobe signal, serial data supplied from the exterior, and converts said accepted data into parallel data;
   a first and a second memory cell areas which are respectively written each of said parallel data;
   an output conversion unit which converts parallel data constructed by data read from said first and said second memory cell areas into serial data, and sequentially outputs, twice per cycle of a clock signal, said converted serial data; and
   an operational unit which performs a logic operation on said parallel data read from said first and said second memory cell areas, and outputs the operation result at once in synchronization with said clock signal during a testing mode.

7. A semiconductor integrated circuit comprising:
   an input conversion unit which converts serial data supplied from the exterior into parallel data;
   a plurality of memory cell areas which is respectively written each of said parallel data;
   an output conversion unit which converts parallel data constructed by data read from each said memory cell area into serial data; and
   a writing unit which simultaneously writes data supplied from the exterior in each said memory cell area during a testing mode.

8. A semiconductor integrated circuit according to claim 7, wherein said writing unit writes data supplied from one of a plurality of input/output terminals in each said memory cell area which respectively corresponds to said plurality of input/output terminals.

9. A semiconductor integrated circuit according to claim 8, comprising a plurality of said writing units.

10. A semiconductor integrated circuit according to claim 8, wherein said testing mode is a data compression test mode which compresses together data in an internal data bus corresponding to each said input/output terminal and performs an operation test.

11. A semiconductor integrated circuit according to claim 7, comprising a command controlling unit which receives a plurality of command input signals which is supplied from the exterior, and determines a operation mode; and
    wherein said operation mode shifts to said testing mode based on said command input.

12. A semiconductor integrated circuit comprising:
    an input conversion unit which sequentially accepts, twice per cycle of a data strobe signal, serial data supplied from the exterior, and converts said accepted data into parallel data;
    a first and a second memory cell areas which are respectively written each of said parallel data;
    an output conversion unit which converts parallel data constructed by data read from said first and said second memory cell areas into serial data, and sequentially outputs, twice per cycle of a clock signal, said converted serial data; and
    a writing unit which accepts data supplied from the exterior at once, in synchronization with said data strobe signal, and writes the accepted data in said first and said second memory cell areas simultaneously in synchronization with said clock signal.

13. A semiconductor integrated circuit comprising:
    an input conversion unit which converts serial input data into parallel input data;
    a plurality of memory cell areas, each of which are written corresponding to said parallel input data; and
    an operational unit receiving parallel output data corresponding to said serial input data read from said memory cell areas, the operational unit executing a logic operation of said parallel output data in a test mode.

* * * * *